US009711528B2

(12) United States Patent
Matsuda et al.

(10) Patent No.: US 9,711,528 B2
(45) Date of Patent: Jul. 18, 2017

(54) SEMICONDUCTOR MEMORY DEVICE

(71) Applicant: Kabushiki Kaisha Toshiba, Minato-ku (JP)

(72) Inventors: Toru Matsuda, Yokkaichi (JP); Kenichi Fujii, Yokkaichi (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 15/062,291

(22) Filed: Mar. 7, 2016

(65) Prior Publication Data

US 2017/0098658 A1 Apr. 6, 2017

Related U.S. Application Data

(60) Provisional application No. 62/237,634, filed on Oct. 6, 2015.

(51) Int. Cl.

| | |
|---|---|
| ***H01L 27/115*** | (2017.01) |
| ***H01L 27/11582*** | (2017.01) |
| ***H01L 27/11565*** | (2017.01) |
| ***H01L 27/11519*** | (2017.01) |
| ***H01L 27/11556*** | (2017.01) |
| ***H01L 23/00*** | (2006.01) |

(52) U.S. Cl.

CPC ...... *H01L 27/11582* (2013.01); *H01L 23/562* (2013.01); *H01L 27/11519* (2013.01); *H01L 27/11556* (2013.01); *H01L 27/11565* (2013.01)

(58) Field of Classification Search

CPC ......... H01L 27/11582; H01L 27/11565; H01L 23/562; H01L 27/11556; H01L 27/11519

See application file for complete search history.

(56) References Cited

U.S. PATENT DOCUMENTS

| | | | |
|---|---|---|---|
| 8,569,829 B2 | 10/2013 | Kiyotoshi | |
| 8,749,078 B2 | 6/2014 | Murakami | |
| 9,419,011 B2 * | 8/2016 | Lee | H01L 27/11565 |

FOREIGN PATENT DOCUMENTS

| | | |
|---|---|---|
| JP | 2010-225694 | 10/2010 |
| JP | 2011-138945 | 7/2011 |
| JP | 2013-187338 | 9/2013 |

* cited by examiner

*Primary Examiner* — Roy Potter
*Assistant Examiner* — Paul Patton
(74) *Attorney, Agent, or Firm* — Oblon, McClelland, Mair & Neustadt, L.L.P.

(57) ABSTRACT

According to an embodiment, a semiconductor memory device comprises a first region, a second region, and a third region. The first region includes: a part of a stacked body that includes a plurality of conductive layers; and a memory columnar body which has its side surface covered by the stacked body and configures a memory string. The second region includes: a contact; a contact portion connected to the contact, of the conductive layer; and a plurality of first columnar bodies. The third region includes a second columnar body. In a plane parallel to the substrate, a total area of the second columnar body in a small region that has the same area as one or more contact portions, in the third region is larger than a total area of the first columnar body in the one or more contact portions.

27 Claims, 29 Drawing Sheets

9
HOST
External Control Signal
External I/O
Internal Control Signal
7
State Machine
6
Command I/F
4
Data Input/ Output Buffer
5
Address Register
1
Memory Cell Array
MB
MB
MB
MB
2
Column Control Circuit
3
Row Control Circuit
10
Voltage Generating Circuit LB(LBb)
LB(LBa)
102
102a
102b
CR
DR(DR2)
DR(DR1)
e1
e2
111
105
MR
MR(MRb)
ST
109
A
A'
X
Y
Z 101
A'
A
DR(DR2)
DR(DR1)
MR
CR
LB
111
111
111
111
102(SGD)
102(SGS)
105
105
MS
STD
STS
103
103
109
109
110
Z
X
Y
102
(WL)

W3
LB(LBb)
102
CR
DR(DR2)
111'
111
DR(DR1)
ST
105
MR(MRb)
MR
MF
109
11
DR(DR1)
111'
DR(DR2)
LB(LBa)
A
A'
W1
W2
X
Y
Z 111
111"
W4
102
105
109
110
103
111
W5
101
A
A'
DR(DR2)
DR(DR1)
MR
CR
Z
X
Y

LB(LBa)
LB(LBb)
102
105
MR(MRb)
MR
111'''
ST
DR(DR1)
DR(DR2)
CR
109
111
p1
p2
A
A'
X
Y
Z

LB(LBa)
LB(LBb)
102
CR
DR(DR2)
DR(DR1)
151
111
150
W2/2
ST
105
MR(MRb)
MR
MF
109
e1
e2
A
A'
W2
X
Y
Z

LB(LBb)
LB(LBa)
102
105
111
109
CR
DR(DR1)
DR(DR2)
MR
MR(MRb)
ST
e1
e2
A
A'
X
Y
Z

Z
X
Y
109
110
111
102
(WL)
103
STD
105
102(SGD)
111
LB
A
CR
MR
MS
DR(DR1)
DR(DR2)
101
A'

LB(LBb)
LB(LBa)
102
105
MR
MR(MRb)
ST
151
DR(DR1)
DR(DR2)
150
e1
e2
111
109
CR
A
A'
X
Y
Z

Z
X
Y
110
109
111
102
(WL)
103
STD
105
102(SGD)
151
111
LB
111
151
150
150
101
A
A'
CR
103
MS
MR
DR(DR1)
DR(DR2)

DR(DR3)
LB
ST
MR
CR
111
e3
105
109
X
Y
Z

Z
Y
X
111
102
(WL)
103
105
102(SGD)
105
111
LB
111
150
150
103
101
A
MR
DR(DR3)
DR(DR3)
A'

102b
DR(DR3)
LB
111
e3
ST
102b
105
MR
CR
102a
109
X
Y
Z

LB(LBb)
102
105
MR(MRb)
ST
151
DR(DR1)
150
e1
e2
111
DR(DR2)
LB(LBa)
CR
109
W2
A
A'
111
150
151
DR(DR1)
ST
105
MR
MF
109
ST
111
DR(DR2)
CR
X
Y
Z

Z
Y
X
MF
106(BL)
107(SL)
108(LI)
110
111
109
102a
STD
MC
STS
STSb
105(122)
102(SGD)
102(WL)
102(SGS)
102(SGSb)
203
202
201

SEMICONDUCTOR MEMORY DEVICE

CROSS-REFERENCE TO RELATED APPLICATIONS

This application is based upon and claims the benefit of U.S. Provisional Patent Application No. 62/237,634, filed on Oct. 6, 2015, the entire contents of which are incorporated herein by reference.

BACKGROUND

Field

Embodiments described herein relate to a semiconductor memory device.

Description of the Related Art

A flash memory that stores data by accumulating a charge in a charge accumulation layer, is known. Such a flash memory is connected by a variety of systems such as NAND type or NOR type, and configures a semiconductor memory device. In recent years, increasing of capacity and raising of integration level of such a nonvolatile semiconductor memory device have been proceeding. Moreover, a semiconductor memory device in which memory cells are disposed three-dimensionally (three-dimensional type semiconductor memory device) has been proposed to raise the integration level of the memory.

DETAILED DESCRIPTION

Figure 1:
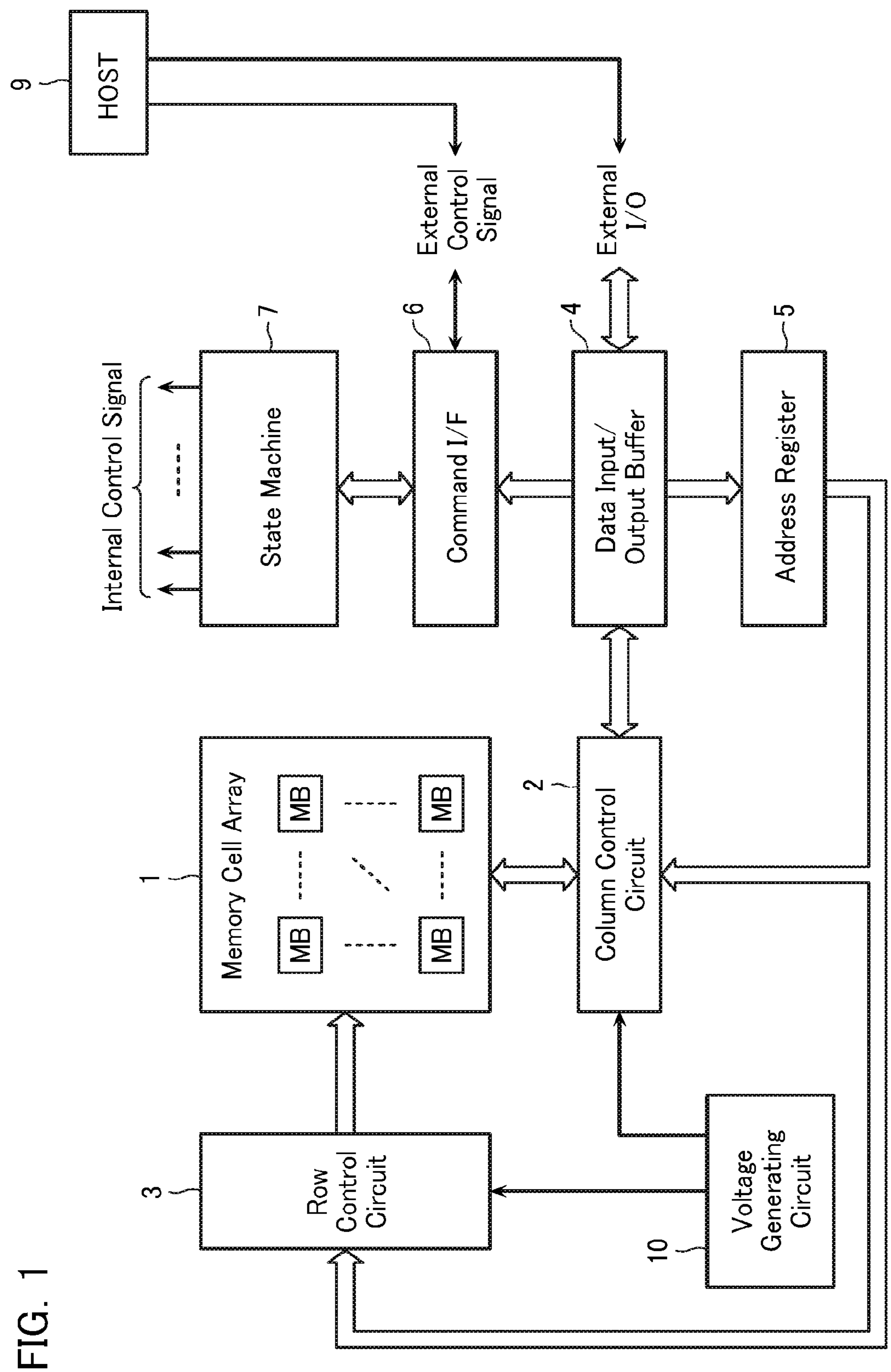
FIG. 1 is a block diagram of a nonvolatile semiconductor memory device according to a first embodiment.

A semiconductor memory device according to an embodiment comprises a first region, a second region, and a third region. The first region includes: a part of a stacked body that includes a plurality of conductive layers stacked above a substrate; and a memory columnar body which is provided along a first direction intersecting the substrate, has its side surface covered by this stacked body and, configures a memory string. The second region includes: a contact, a contact portion connected to the contact, of the conductive layer; and a plurality of first columnar bodies provided along the first direction and each having their side surface covered by the stacked body. The third region includes: another part of the stacked body; and a second columnar body provided along the first direction and having its side surface covered by the stacked body. Moreover, in a plane parallel to the substrate, a total area of the second columnar body in a small region that has the same area as one or more contact portions, in the third region being larger than a total area of the first columnar body in the one or more contact portions.

Next, nonvolatile semiconductor memory devices according to embodiments will be described in detail with reference to the drawings. Note that these embodiments are merely examples, and are not shown with the intention of limiting the present invention.

For example, the nonvolatile semiconductor memory devices described below have a structure in which a memory string extends linearly in a direction intersecting (perpendicular to) a substrate, but a similar structure may be applied also to a U-shaped structure in which the memory string is doubled back on an opposite side midway. Moreover, each of the drawings of the nonvolatile semiconductor memory devices employed in the embodiments below is schematic, and thicknesses, widths, ratios, and so on, of layers are different from those of the actual nonvolatile semiconductor memory devices.

In addition, the nonvolatile semiconductor memory devices described below relate to nonvolatile semiconductor memory devices having a structure in which a plurality of MONOS (Metal-Oxide-Nitride-Oxide-Semiconductor) type memory cells (memory transistors) are provided in a height direction, each of the MONOS type memory cells including: a semiconductor layer acting as a channel body provided in a column shape intersecting a substrate; and a control gate electrode layer made of metal facing a side surface of the semiconductor layer via a charge accumulation layer. However, this is also not intended to limit the present invention, and the present invention may be applied also to a structure having another structure, for example, a structure having a SONOS (Semiconductor-Oxide-Nitride-Oxide-Semiconductor) type memory cell that includes charge accumulation layer, a control gate electrode made of a semiconductor, or a structure having a floating gate type memory cell.

With regard to an example of the structure having the floating gate type memory cell, reference is made to the U.S. patent application Ser. No. 13/112,345 whose disclosure content is herewith incorporated by this reference.

[First Embodiment]

[Semiconductor Memory Device]

FIG. 1 is a block diagram of a nonvolatile semiconductor memory device according to a first embodiment. The same nonvolatile semiconductor memory device stores user data inputted from an external host 9, in a memory cell array 1. In addition, the same nonvolatile semiconductor memory device reads user data from the memory cell array 1, and outputs the user data to the external host 9.

That is, as shown in FIG. 1, the same nonvolatile semiconductor memory device comprises the memory cell array 1 that stores user data. The memory cell array 1 comprises a plurality of memory blocks MB. These memory blocks MB each record user data.

In addition, as shown in FIG. 1, the same nonvolatile semiconductor memory device comprises a column control circuit 2. The column control circuit 2 comprises an unillustrated sense amplifier, and performs read of user data, and so on. Moreover, the column control circuit 2, when performing write of user data, transfers a voltage generated by a voltage generating circuit 10, to the memory cell array 1, according to the inputted user data.

As shown in FIG. 1, the same nonvolatile semiconductor memory device comprises a row control circuit 3. The row control circuit 3 specifies a position for performing read or write of user data in the memory cell array, according to inputted address data.

As shown in FIG. 1, the same nonvolatile semiconductor memory device comprises an address register 5 that supplies address data to the column control circuit 2 and the row control circuit 3. The address register 5 stores address data inputted from a data input/output buffer 4.

As shown in FIG. 1, the same nonvolatile semiconductor memory device comprises the voltage generating circuit 10 that supplies a voltage to the memory cell array 1 via the column control circuit 2 and the row control circuit 3. The voltage generating circuit 10 generates and outputs a voltage of a certain magnitude at a certain timing, based on an internal control signal inputted from a state machine 7.

As shown in FIG. 1, the same nonvolatile semiconductor memory device comprises the state machine 7 that inputs the internal control signal to the voltage generating circuit 10, and so on. The state machine 7 receives command data from the host 9, via a command interface 6, and performs management of read, write, erase, input/output of data, and so on.

As shown in FIG. 1, the same nonvolatile semiconductor memory device comprises the data input/output buffer 4. The data input/output buffer 4 receives user data from the column control circuit 2, and transfers the user data to the external host 9. Moreover, the data input/output buffer 4 receives user data from the external host 9, and transfers the user data to the column control circuit 2. In addition, the data input/output buffer 4 receives command data from the external host 9, and transfers the command data to the command interface 6. Moreover, the data input/output buffer 4 receives address data from the external host 9, and transfers the address data to the address register 5.

As shown in FIG. 1, the same nonvolatile semiconductor memory device comprises the command interface 6. The command interface 6 determines which of user data, command data, and address data data inputted to the data input/output buffer 4 is, based on an external control signal inputted from the external host 9, and controls the data input/output buffer 4. In addition, the command interface 6 transfers to the state machine 7 command data received from the data input/output buffer 4.

Note that the column control circuit 2, the row control circuit 3, the state machine 7, the voltage generating circuit 10, and so on, configure a control circuit that controls the memory cell array 1.

Figure 2:
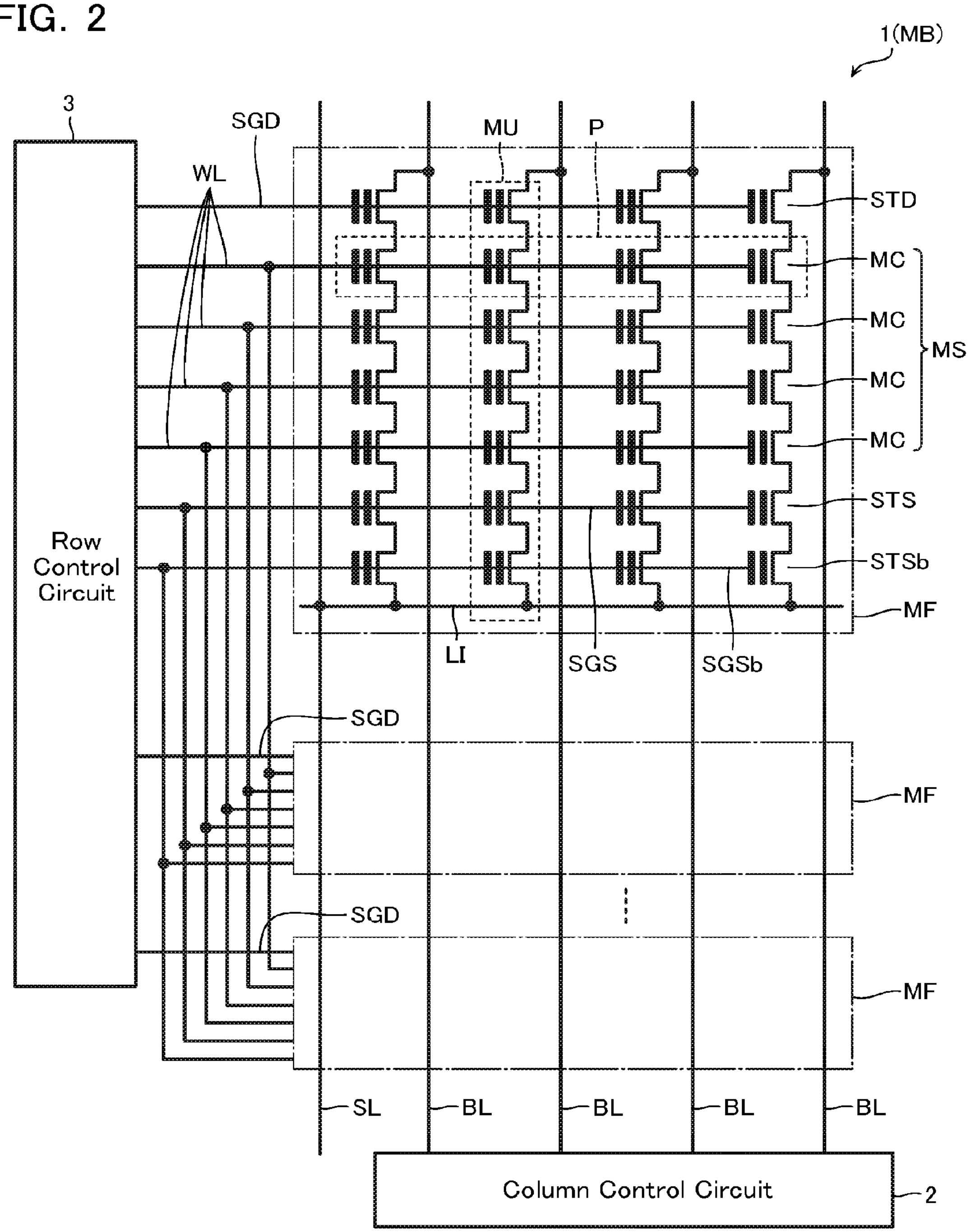
FIG. 2 is a circuit diagram showing a configuration of part of the same nonvolatile semiconductor memory device.

Next, a circuit configuration of part of the memory cell array 1 according to the present embodiment will be described with reference to FIG. 2. FIG. 2 is an equivalent circuit diagram showing a configuration of the memory block MB configuring the memory cell array 1.

The memory block MB stores user data which is batch erased in an erase operation, for example. As shown in FIG. 2, the memory block MB comprises a plurality of memory fingers MF. Moreover, the memory finger MF comprises a plurality of pages P. The pages P each store user data which is batch read in a read operation. In addition, the page P comprises a plurality of memory cells MC. The memory cells MC each store a one-bit portion or a multiple-bit portion of data configuring the user data.

For example, when performing the read operation, the row control circuit 3 selects a certain drain side select gate line SGD based on address data, thereby selecting a certain memory finger MF. In addition, the row control circuit 3 selects a certain word line WL based on address data, thereby selecting a certain page P. The plurality of memory cells MC included in the selected page P are each connected to the column control circuit 2 via a bit line BL. The column control circuit 2 reads data recorded in the memory cell MC based on a current or voltage of the bit line BL. Moreover, the column control circuit 2 outputs the read data as user data.

That is, as shown in FIG. 2, the memory blocks MB each comprise a plurality of the memory fingers MF. Moreover, the memory finger MF comprises a plurality of memory units MU. These plurality of memory units MU are respectively connected, at their one ends, to a plurality of the bit lines BL. In addition, these plurality of memory units MU are each connected, at their other ends, to a common source contact LI, and are connected to a source line SL via the source contact LI.

As shown in FIG. 2, the memory unit MU comprises a plurality of the memory cells MC connected in series. The memory cell MC comprises: a semiconductor layer functioning as a channel body; a charge accumulation layer; and a control gate electrode. Moreover, the memory cell MC accumulates a charge in the charge accumulation layer based on a voltage applied to the control gate electrode, and changes a control gate voltage for rendering the channel body in a conductive state (threshold voltage). Hereafter, the plurality of memory cells MC connected in series will be called a "memory string MS".

As shown in FIG. 2, the word line WL is connected to the control gate electrode of the memory cell MC. The word lines WL are provided independently for each of the plurality of memory cells MC configuring the memory string MS. Moreover, the word line WL is provided commonly for the plurality of memory cells MC included in a common page P. In addition, the word line WL is provided commonly for the plurality of memory fingers MF.

As shown in FIG. 2, the memory unit MU comprises a drain side select gate transistor STD connected between the memory string MS and the bit line BL. Moreover, the drain side select gate line SGD is connected to a control gate of the drain side select gate transistor STD. The drain side select gate line SGD is provided independently for each of the plurality of memory fingers MF. Moreover, the drain side select gate line SGD is provided commonly for the plurality of drain side select gate transistors STD included in a common memory finger MF.

In addition, as shown in FIG. 2, the memory unit MU comprises a source side select gate transistor STS and a lowermost layer source side select gate transistor STSb that are connected between the memory string MS and the source contact LI. A source side select gate line SGS and a lowermost layer source side select gate line SGSb are respectively connected to control gates of these source side select gate transistor STS and lowermost layer source side select gate transistor STSb. Moreover, these source side select gate line SGS and lowermost layer source side select gate line SGSb are provided commonly for all of the source side select gate transistors STS and lowermost layer source side select gate transistors STSb in the memory block MB.

Note that a dummy memory cell may be provided between the plurality of memory cells MC and the source side select gate transistor STS. As mentioned above, the memory cells MC each store a one-bit portion or a multiple-bit portion of data configuring the user data. In contrast, data is not recorded in the dummy memory cell.

Figure 3:
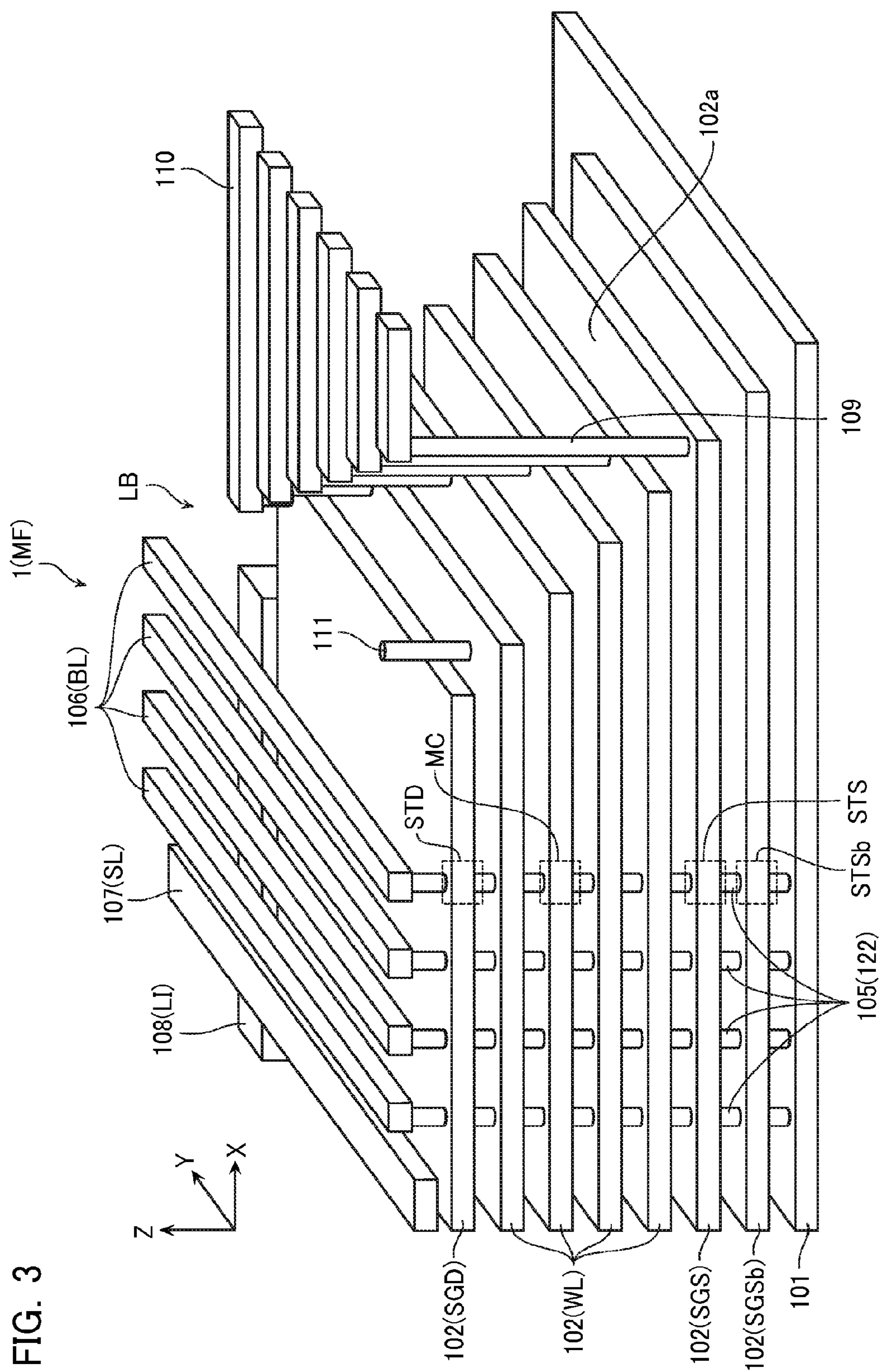
FIG. 3 is a perspective view showing a configuration of part of the same nonvolatile semiconductor memory device.

Next, a schematic configuration of the memory cell array 1 will be described with reference to FIG. 3. FIG. 3 is a schematic perspective view showing a configuration of part of the memory finger MF. Note that in FIG. 3, part of the configuration is omitted. Moreover, FIG. 3 is illustrated for explanation, and a specific configuration may be appropriately changed.

As shown in FIG. 3, the memory finger MF comprises a substrate 101; and a stacked body LB including a plurality of conductive layers 102 stacked in a Z direction on the substrate 101. In addition, the memory finger MF includes a plurality of memory columnar bodies 105 provided along the Z direction. As shown in FIG. 3, an intersection of the conductive layer 102 and the memory columnar body 105 functions as the lowermost layer source side select gate transistor STSb, the source side select gate transistor STS, the memory cell MC, or the drain side select gate transistor STD. In other words, the memory columnar body 105, together with the stacked body LB, configures the memory string MS, and so on. The conductive layer 102 is configured from a conductive layer of the likes of tungsten (W) or polysilicon, for example, and functions as each of the word line WL and control gate electrode of the memory cell MC, the source side select gate line SGS and control gate electrode of the source side select gate transistor STS, the drain side select gate line SGD and control gate electrode of the drain side select gate transistor STD, or the lowermost layer source side select gate line SGSb and control gate electrode of the lowermost layer source side select gate transistor STSb.

As shown in FIG. 3, the stacked body LB including the plurality of conductive layers 102 has a stepped structure at its end in an X direction. That is, the conductive layer 102 comprises a contact portion 102*a* that projects in the X direction with respect to the conductive layer 102 positioned in a layer above it. Moreover, the conductive layer 102 is connected to a via contact 109 at a surface of this contact portion 102*a*. Moreover, a wiring line 110 is provided at an upper end of the via contact 109. Note that the via contact 109 and the wiring line 110 are configured from a conductive layer of the likes of tungsten.

In addition, as shown in FIG. 3, the memory finger MF comprises a dummy structure 111. The dummy structure 111 is a columnar member (columnar body) provided along the Z direction, and communicates with holes provided in the plurality of conductive layers 102. The dummy structure 111 is a support structure that supports a posture of the likes of an unillustrated insulating layer provided between the conductive layers 102, in a manufacturing step. The dummy structure 111 may have a structure similar to that of the memory columnar body 105, or may be formed from an insulating layer of the likes of silicon oxide ($SiO_2$), for example. Moreover, the dummy structure 111 may have a size similar to that of the memory columnar body 105, or may be formed larger than the memory columnar body 105. Note that in FIG. 3, only one dummy structure 111 is described, but a plurality of dummy structures may be provided.

In addition, as shown in FIG. 3, the memory finger MF comprises a conductive layer 108 functioning as the source contact LI. The conductive layer 108 is configured from a conductive layer of the likes of tungsten (W), for example. The conductive layer 108 faces side surfaces in a Y direction of the plurality of conductive layers 102, and has a plate-like shape extending in the X direction and the Z direction. Moreover, a lower end of the conductive layer 108 contacts the substrate 101.

In addition, as shown in FIG. 3, the memory finger MF comprises: a plurality of conductive layers 106 functioning as the bit lines BL; and a conductive layer 107 functioning as the source line SL. The conductive layer 106 and the conductive layer 107 are configured from a conductive layer of the likes of tungsten (W), for example. The plurality of conductive layers 106 and the conductive layer 107 are positioned upwardly of the plurality of conductive layers 102 and the memory columnar body 105, are arranged in plurality in the X direction, and extend in the Y direction. The memory columnar bodies 105 are respectively connected to lower surfaces of the conductive layers 106.

Figure 4:
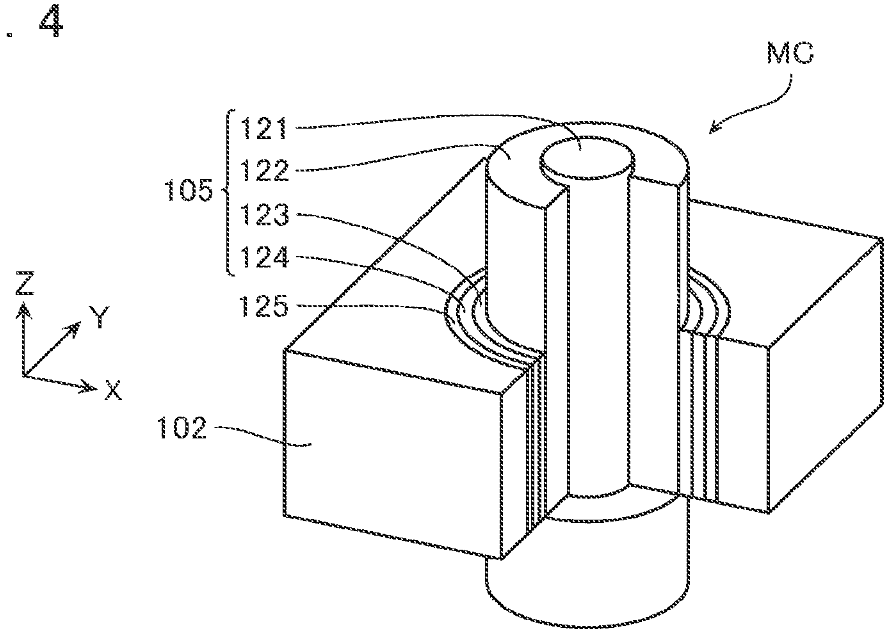
FIG. 4 is a perspective view showing a configuration of part of the same nonvolatile semiconductor memory device.

Next, a schematic configuration of the memory cell MC will be described with reference to FIG. 4. FIG. 4 is a schematic perspective view showing the configuration of the memory cell MC. Note that FIG. 4 shows the configuration of the memory cell MC, but the lowermost layer source side select gate transistor STSb, the source side select gate transistor STS, and the drain side select gate transistor STD may also be configured similarly to the memory cell MC. Note that in FIG. 4, part of the configuration is omitted.

As shown in FIG. 4, the memory cell MC is provided at an intersection of the conductive layer 102 and the memory columnar body 105. The memory columnar body 105 comprises: a core insulating layer 121; and a semiconductor layer 122, a tunnel insulating layer 123, and a charge accumulation layer 124 that are stacked on a sidewall of the core insulating layer 121. Furthermore, a block insulating layer 125 is provided between the memory columnar body 105 and the conductive layer 102.

The core insulating layer 121 is configured from an insulating layer of the likes of silicon oxide ($SiO_2$), for example. The semiconductor layer 122 is configured from a semiconductor layer of the likes of polysilicon, for example, and functions as a channel body of the memory cell MC, the lowermost layer source side select gate transistor STSb, the source side select gate transistor STS, and the drain side select gate transistor STD. The tunnel insulating layer 123 is configured from an insulating layer of the likes of silicon oxide ($SiO_2$), for example. The charge accumulation layer 124 is configured from an insulating layer capable of accumulating a charge, of the likes of silicon nitride ($Si_3N_4$), for example. The block insulating layer 125 is configured from an insulating layer of the likes of silicon oxide ($SiO_2$), for example.

Figure 5:
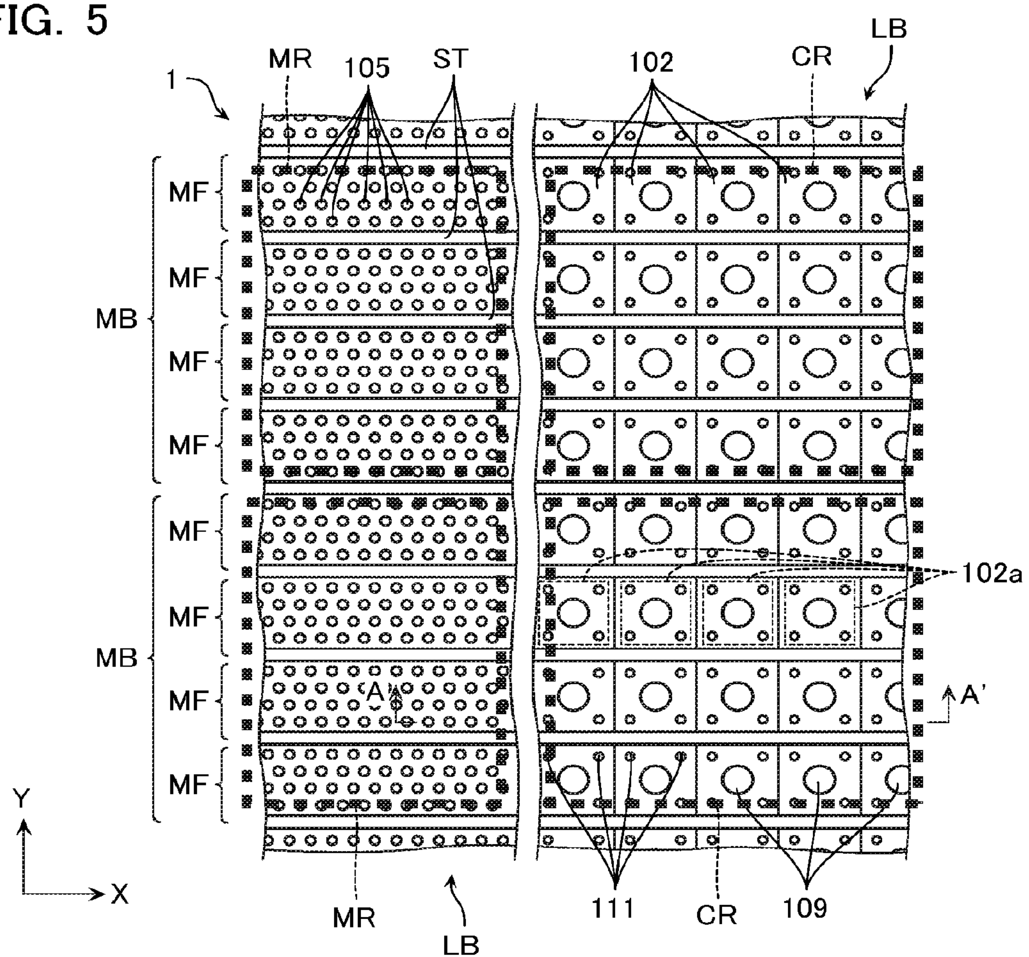
FIG. 5 is a plan view showing a configuration of part of the same nonvolatile semiconductor memory device.
Figure 6:
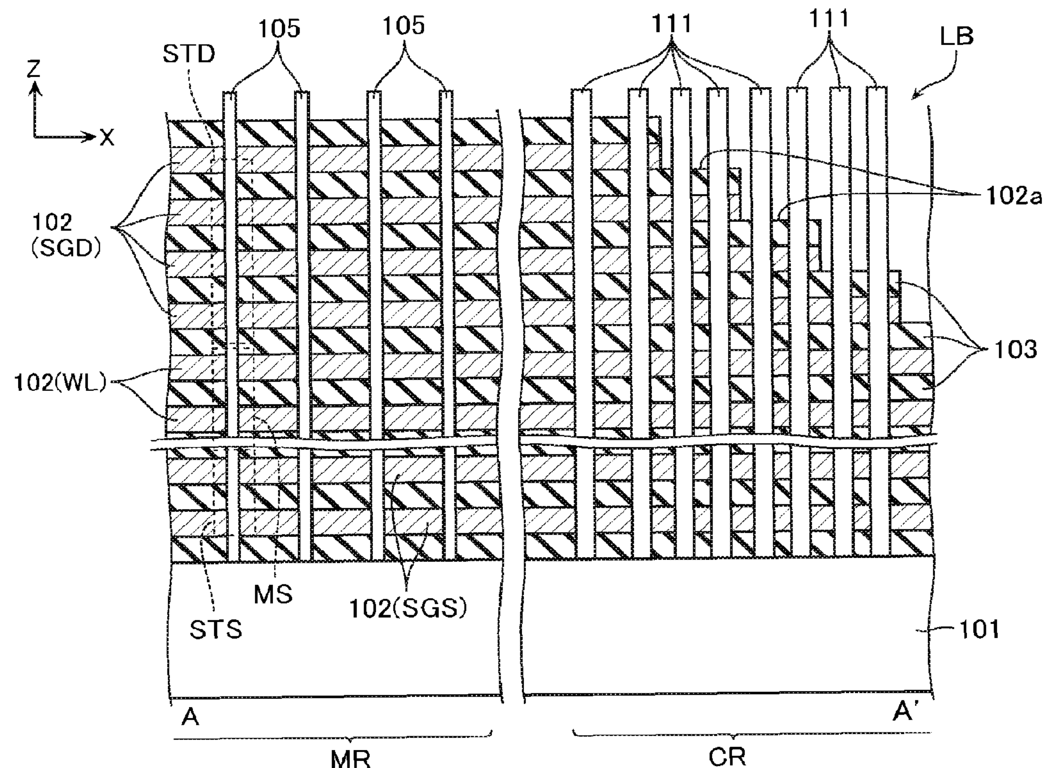
FIG. 6 is a cross-sectional view showing a configuration of part of the same nonvolatile semiconductor memory device.

Next, the nonvolatile semiconductor memory device according to the present embodiment will be described in more detail with reference to FIGS. 5 and 6. FIG. 5 is a plan view showing a configuration of part of the same nonvolatile semiconductor memory device. FIG. 6 is a cross-sectional view showing a configuration of part of the same nonvolatile semiconductor memory device, and shows a cross-section of a portion corresponding to the line A-A' of FIG. 5. Note that in FIGS. 5 and 6, part of the configuration is omitted. Moreover, FIGS. 5 and 6 are illustrated for explanation, and a specific configuration may be appropriately changed.

As shown in FIG. 5, the semiconductor memory device according to the present embodiment comprises a memory region MR and a contact region CR. The memory region MR includes: a part of the stacked body LB including a plurality of the conductive layers 102; and a plurality of the memory columnar bodies 105. The memory region MR functions as the memory block MB. The contact region CR has surfaces of the plurality of conductive layers 102 connected to the via contact 109.

As shown in FIG. 5, a plurality of the memory regions MR are provided in the Y direction via a slit ST, each of the memory regions MR functioning as the memory block MB. As described with reference to FIG. 2, the memory block MB stores user data which is batch erased in an erase operation, for example. Moreover, the memory region MR comprises a plurality of the memory fingers MF adjacent in the Y direction via the slit ST. Note that although illustration thereof is omitted in FIG. 5, the slit ST is provided with an unillustrated conductive layer 108 (source contact LI, refer to FIG. 3) and inter-layer insulating layer. Moreover, in the example shown in FIG. 5, one memory block MB comprises four memory fingers MF, but the number of memory fingers MF in the memory block MB may be appropriately changed. For example, the number of memory fingers MF in the memory block MB may be from one to three, or may be five or more.

As shown in FIG. 6, the memory region MR includes: a part of the stacked body LB that includes a plurality of the conductive layers 102 stacked via an inter-layer insulating layer 103; and the memory columnar body 105 whose side surface is covered by the stacked body LB. The conductive layer 102 is configured from a conductive layer of the likes of tungsten (W), for example, and functions as the word line WL, and so on. Moreover, as shown in FIG. 5, the conductive layer 102 (stacked body LB) has the X direction as its longitudinal direction. As described with reference to FIG. 4, the memory columnar body 105 comprises: the core insulating layer 121 ($SiO_2$); and the semiconductor layer 122 (polysilicon), the tunnel insulating layer 123 ($SiO_2$), and the charge accumulation layer 124 (SiN) that are stacked on the sidewall of the core insulating layer 121. Moreover, as shown in FIG. 6, the memory columnar bodies 105 each, together with the stacked body LB, configure the memory string MS. In addition, as shown in FIG. 5, the memory columnar bodies 105 are disposed staggered with a certain density. Note that an arrangement of the memory columnar bodies 105 may be appropriately changed to the likes of a triangular arrangement or a square arrangement. Note that the memory columnar body 105 is connected to the bit line BL provided upwardly of the stacked body LB, via an unillustrated bit line contact (refer to FIG. 3).

As shown in FIG. 5, a plurality of the contact regions CR are provided in the Y direction via the slit ST. Each of the contact regions CR is adjacent to the memory region MR from the X direction. The contact region CR includes: a part of the stacked body LB; and the via contact 109 connected to the surface of the conductive layer 102. As shown in FIG. 6, the stacked body LB is formed in a stepped shape such that in the contact region CR, the contact portion **102*a* of the conductive layer 102 of a lower layer protrudes in the X direction with respect to the conductive layer 102 of a higher layer. As shown in FIG. 5, in the contact region CR, the contact portions 102*a* of the plurality of conductive layers 102 included in the stacked body LB are provided in a matrix in the X direction and the Y direction. Moreover, a plurality of the via contact 109 are arranged in the X direction and the Y direction, and are respectively connected to the surfaces of the contact portions 102*a* of the plurality of conductive layers 102. The plurality of conductive layers 102 are connected to the wiring line 110 provided upwardly of the stacked body LB, via the plurality of via contact 109 (refer to FIG. 3**).

In addition, as shown in FIG. 5, the contact region CR includes a plurality of the dummy structures 111. As shown in FIG. 6, the dummy structure 111 has its side surface surrounded by the plurality of conductive layers 102 (stacked body LB).

The dummy structure 111 need only have a height sufficient for its side surface to be surrounded by the plurality of conductive layers 102 (stacked body LB). That is, upper ends of all of the dummy structures 111 may be positioned more upwardly than an upper surface of the conductive layer 102 positioned in an uppermost layer as shown in FIG. 6, or the upper end of a certain dummy structure 111, for example, may be positioned more upwardly than all of the conductive layers covering the side surface of this dummy structure 111, and more downwardly than the upper surface of the conductive layer 102 positioned in the uppermost layer.

In the example shown in FIG. 5, the dummy structure 111 is provided at the four corners of the contact portion 102*a* formed in a square shape, so as to surround the via contact 109. However, an arrangement of the dummy structures 111 in the contact portion 102*a* may be appropriately changed, and the dummy structure 111 may be provided so as to be positioned at vertices of a polygon other than a square, for example, or may be provided straddling adjacent contact portions 102*a*, for example.

Next, in order to explain in more detail the configuration of the nonvolatile semiconductor memory device according to the present embodiment, a method of manufacturing the memory cell array 1 will be simply described with reference to FIGS. 7 to 10. FIGS. 7 to 10 are schematic cross-sectional views for explaining the same method of manufacturing.

Figure 7:
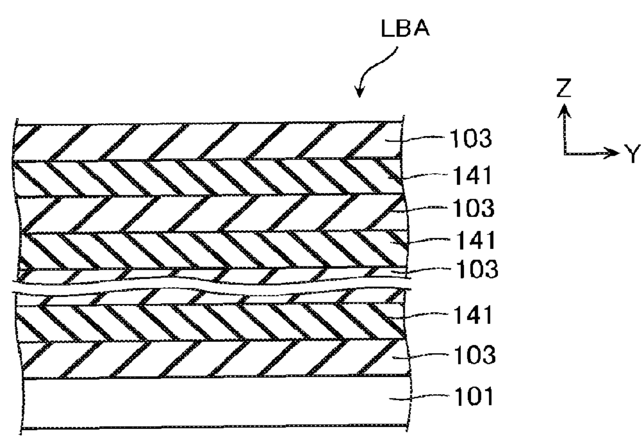
FIG. 7 is a cross-sectional view showing a manufacturing step of part of the same nonvolatile semiconductor memory device.

As shown in FIG. 7, in the method of manufacturing according to the present embodiment, a stacked body LBA including a plurality of the inter-layer insulating layers 103 and sacrifice layers 141 is formed above the substrate 101. The inter-layer insulating layer 103 is formed by depositing an insulating layer of the likes of silicon oxide ($SiO_2$), by a method such as CVD (Chemical Vapor Deposition), for example. The sacrifice layer 141 is formed by depositing the likes of silicon nitride ($Si_3N_4$), for example, by a method such as CVD.

Figure 8:
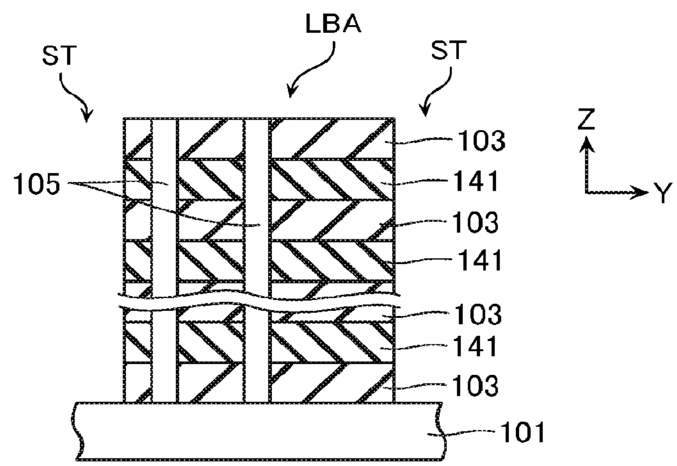
FIG. 8 is a cross-sectional view showing a manufacturing step of part of the same nonvolatile semiconductor memory device.

As shown in FIG. 8, the memory columnar body 105 and the slit ST are formed in this stacked body LBA. In formation of the memory columnar body 105, for example, an opening penetrating the stacked body LBA is formed in this stacked body LBA, silicon oxide ($SiO_2$), silicon nitride ($Si_3N_4$), silicon oxide ($SiO_2$), and polysilicon are sequentially deposited on a sidewall of this opening by a method such as CVD, and silicon oxide ($SiO_2$) is implanted. The slit ST is formed by a means such as RIE (Reactive Ion Etching), for example.

Figure 9:
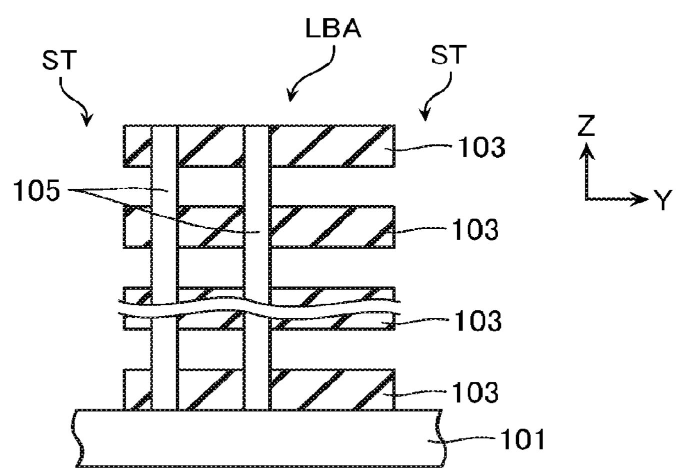
FIG. 9 is a cross-sectional view showing a manufacturing step of part of the same nonvolatile semiconductor memory device.

In addition, as shown in FIG. 9, the sacrifice layer 141 is removed via this slit ST. The sacrifice layer 141 is removed by the likes of wet etching using phosphoric acid, for example. Note that at this time, the sacrifice layer 141 is supported by the plurality of memory columnar bodies 105 and dummy structures 111.

Figure 10:
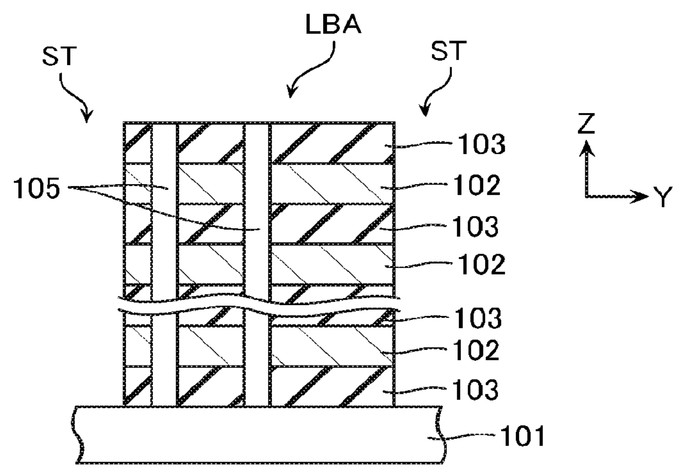
FIG. 10 is a cross-sectional view showing a manufacturing step of part of the same nonvolatile semiconductor memory device.

Moreover, as shown in FIG. 10, the conductive layer 102 is formed, via this slit ST, on upper and lower surfaces of the inter-layer insulating layer 103 and on a side surface of the memory columnar body 105. Formation of the conductive layer 102 is performed by depositing a conductive layer of the likes of tungsten (W) by a method such as CVD, for example. Note that before depositing the tungsten (W), the block insulating layer 125 described with reference to FIG. 4, a metal of high permittivity (for example, alumina ($Al_2O_3$), or the like), a barrier metal layer (for example, titanium nitride (TiN), or the like), and so on, may be deposited.

Figure 11:
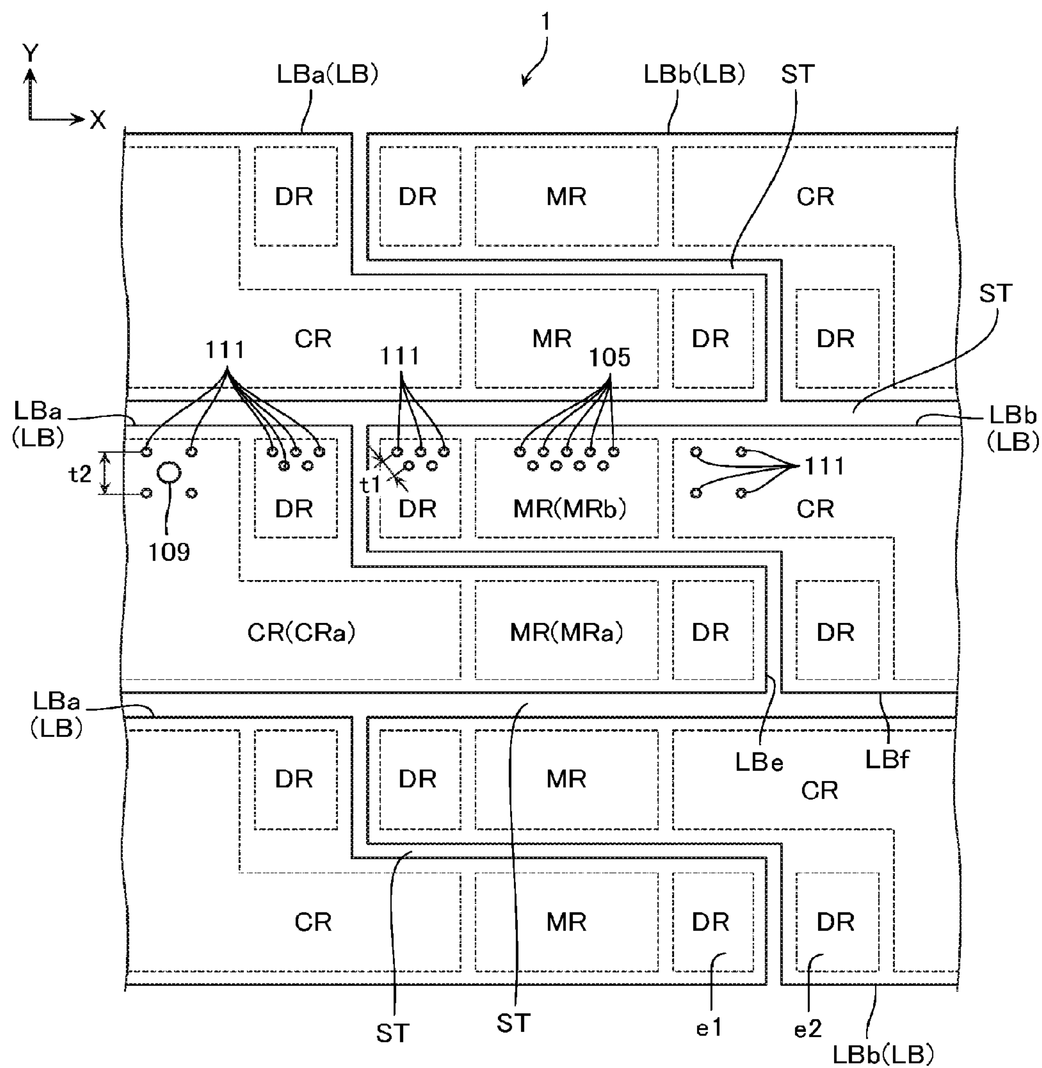
FIG. 11 is a plan view showing a configuration of part of the same nonvolatile semiconductor memory device.

Next, a layout in the memory cell array 1 will be described with reference to FIG. 11. FIG. 11 is a schematic plan view for describing the layout in the memory cell array 1. Note that the layout shown in FIG. 11 is merely an example, and a specific configuration may be appropriately changed.

As shown in FIG. 11, a plurality of the stacked bodies LB (LBa and LBb) described with reference to FIGS. 5 and 6 are arranged in the Y direction via the slit ST, in the memory cell array 1. In addition, the memory cell array 1 comprises the memory regions MR and the contact regions CR corresponding to these plurality of stacked bodies LB (LBa and LBb). The memory regions MR include a plurality of the memory columnar bodies 105. The contact regions CR include the via contact 109 and are respectively adjacent to the memory regions MR from the X direction.

Now, for convenience of reducing circuit area, it is sometimes desired to reduce a width in the X direction of the contact region CR. In order to do this, as shown in FIG. 11, a contact region CRa corresponding to a certain memory region MRa may be provided straddling sides of this memory region MRa and a memory region MRb. The memory region MRb is adjacent from the Y direction to the memory region MRa.

As shown in FIG. 11, when the contact region CRa is provided in this way, it results in the stacked body LB having substantially an L shape that has the X direction as its longitudinal direction. In such a case, sometimes, in relation to layout, a region between the contact region CRa and the memory region MRb (a region indicated by "DR" in FIG. 11) is formed and ends up being a dead space. Hereafter, such a region will be called a "dummy region DR".

The dummy region DR, contrary to the memory region MR or contact region CR, does not include a configuration connected to the control circuit. Therefore, the dummy region DR is not provided with a contact for connecting the dummy structure 111 and the wiring line. Even supposing such a contact has been provided, this contact does not have the wiring line connected thereto, or the wiring line connected to this contact is not connected to the likes of the column control circuit 2 or row control circuit 3.

Now, when, for example, the sacrifice layer 141 is removed in the step described with reference to FIG. 9, the inter-layer insulating layer 103 sometimes ends up deforming due to internal stress of the inter-layer insulating layer 103. Moreover, when the configuration of the kind shown in FIG. 10 is returned to room temperature after the conductive layer 102 has been deposited in the step described with reference to FIG. 10, internal stress is generated by thermal contraction of the conductive layer 102, and the conductive layer 102 sometimes ends up deforming.

In order to suppress deformation of the stacked body LB (LBA) due to such internal stress, at a stage of performing the steps described with reference to FIG. 9 or 10, the contact region CR or dummy region DR are provided with a plurality of the dummy structures 111 as shown in FIG. 11. That is, in these regions, the conductive layer 102 or inter-layer insulating layer 103 are supported by a side surface of the dummy structure 111, and deformation by internal stress of these layers is suppressed by the dummy structure 111.

However, the dummy region DR is provided with an end e1 in the X direction of the stacked body LB or a portion e2 formed in a corner shape. Such portions are easily influenced by internal stress. In addition, the dummy region DR has an area which is smaller compared to that of the contact region CR. Therefore, even if the dummy structures 111 are disposed with the same degree of density as in the contact region CR, it has sometimes been impossible for a sufficient number of dummy structures 111 to be provided in the dummy region DR and for the conductive layer 102 or inter-layer insulating layer 103 to be sufficiently supported in the dummy region DR.

Accordingly, as shown in FIG. 11, in the present embodiment, an area of the dummy structures 111 per unit area in the dummy region DR is made larger than an area of the dummy structures 111 per unit area in the contact region CR, in the XY plane. In the example shown in FIG. 11, a distance t1 of fellow dummy structures 111 in the dummy region DR is shorter than a distance t2 of fellow dummy structures 111 in the contact region CR, whereby the area of the dummy structures 111 per unit area in the dummy region DR is increased. As a result, internal stresses of the likes of the conductive layer 102 or inter-layer insulating layer 103 are canceled out, and deformation of the stacked body LB during manufacturing steps is suppressed.

Note that a position in the Z direction of the XY plane configured such that the area of the dummy structures 111 per unit area in the dummy region DR is larger than the area of the dummy structures 111 per unit area in the contact region CR can be arbitrarily set in a range that the dummy structures 111 are positioned. For example, the position in the Z direction of such an XY plane may be a position corresponding to the conductive layer 102 functioning as the drain side select gate line SGD, may be a position corresponding to the conductive layer 102 functioning as the word line WL, or may be another position. Moreover, this XY plane may be specified along any conductive layer 102 or inter-layer insulating layer 103.

Figure 12:
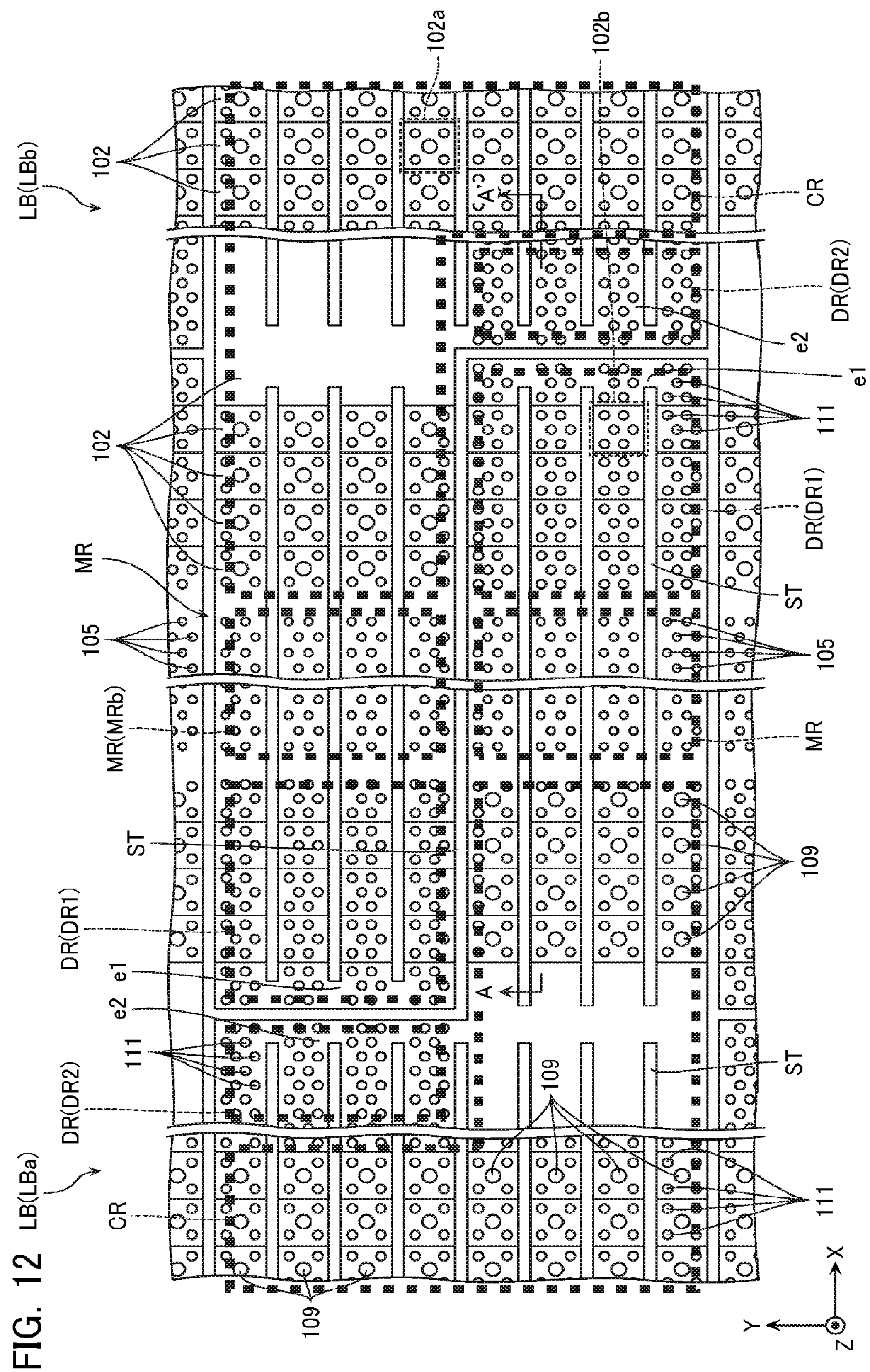
FIG. 12 is a plan view showing a configuration of part of the same nonvolatile semiconductor memory device.
Figure 13:
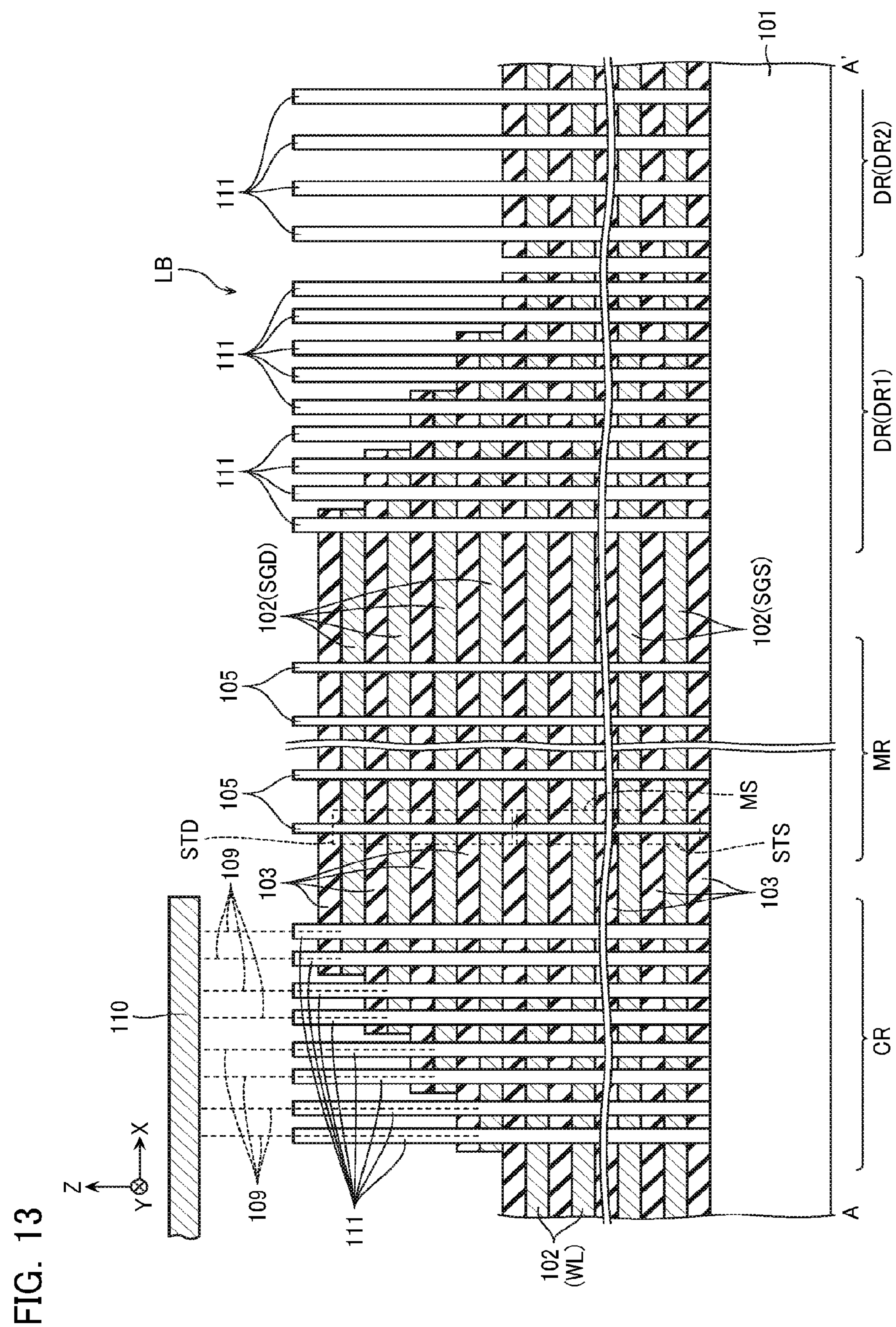
FIG. 13 is a cross-sectional view showing a configuration of part of the same nonvolatile semiconductor memory device.

Next, the dummy region DR will be described in more detail with reference to FIGS. 12 and 13. FIG. 12 is a plan view for explaining the dummy region DR. FIG. 13 is a cross-sectional view in the dummy region DR, and shows a cross-section of a portion corresponding to the line A-A' of FIG. 12. Note that in FIGS. 12 and 13, part of the configuration is omitted.

As described with reference to FIG. 11, a plurality of the stacked bodies LB configured in substantially an L shape are provided in the Y direction in the memory cell array 1. Moreover, each of the stacked bodies LB is provided with the memory region MR and the contact region CR. Furthermore, provided between the contact region CRa of a certain stacked body LBa and the memory region MRb of the stacked body LBb adjacent from the Y direction to this stacked body LBa are the dummy regions DR (DR1 and DR2). Note that the dummy region DR2 provided in the stacked body LBa is adjacent from the X direction to the dummy region DR1 provided in the stacked body LBb.

As shown in FIG. 13, the dummy region DR1 includes a part of the stacked body LB and a plurality of the dummy structures 111. As shown in FIG. 12, the dummy region DR1 is provided with the end e1 in the X direction of the stacked body LB that has the X direction as its longitudinal direction. Moreover, as shown in FIG. 13, in the dummy region DR1, the stacked body LB is formed in a stepped shape. The dummy structure 111 has its side surface surrounded by a plurality of the conductive layers 102 (stacked body LB) in the XY plane. In the example shown in FIG. 12, the dummy structures 111 are disposed staggered with the same degree of density as the memory columnar bodies 105 in the memory region MR. However, an arrangement of the dummy structures 111 may be appropriately changed to the likes of a triangular arrangement or a square arrangement.

As shown in FIG. 13, the dummy region DR2, similarly to the dummy region DR1, includes a part of the stacked body LB and a plurality of the dummy structures 111. As shown in FIG. 12, in the dummy region DR2, the stacked body LB is formed in a corner shape and this corner shaped portion e2 is adjacent from the X direction via the slit ST, to the end e1 of the stacked body LB provided in the dummy region DR1. Moreover, in the example shown in FIG. 13, in the dummy region DR2, the stacked body LB is not formed in a stepped shape. Note that in other respects, a configuration in the dummy region DR2 is similar to a configuration in the dummy region DR1.

Note that in the present embodiment, the dummy structures 111 are provided substantially uniformly in the dummy region DR. However, for example, as described later with reference to FIG. 31, it is also possible for the dummy structures 111 to be provided intensively in the likes of a portion where internal stress of the conductive layer 102 or inter-layer insulating layer 103 will be particularly strong, for example, a portion close to the slit ST in particular. Such a method also makes it possible for internal stresses of the likes of the conductive layer 102 or inter-layer insulating layer 103 to be effectively canceled out. In such a case, it is only required that total area of the dummy structures 111 in a small region 102*b* is larger than total area of the dummy structures 111 in one or more contact portions 102*a*. The small region 102*b* has the same area and planar shape (a small portion 102*b* has the same width in the X and Y directions) as these one more contact portions 102*a*.

Note that in the following cases, for example, it could be said that total area of the dummy structures 111 in the small region 102*b* is larger than total area of the dummy structures 111 in the contact portion 102*a*.

Figure 14:
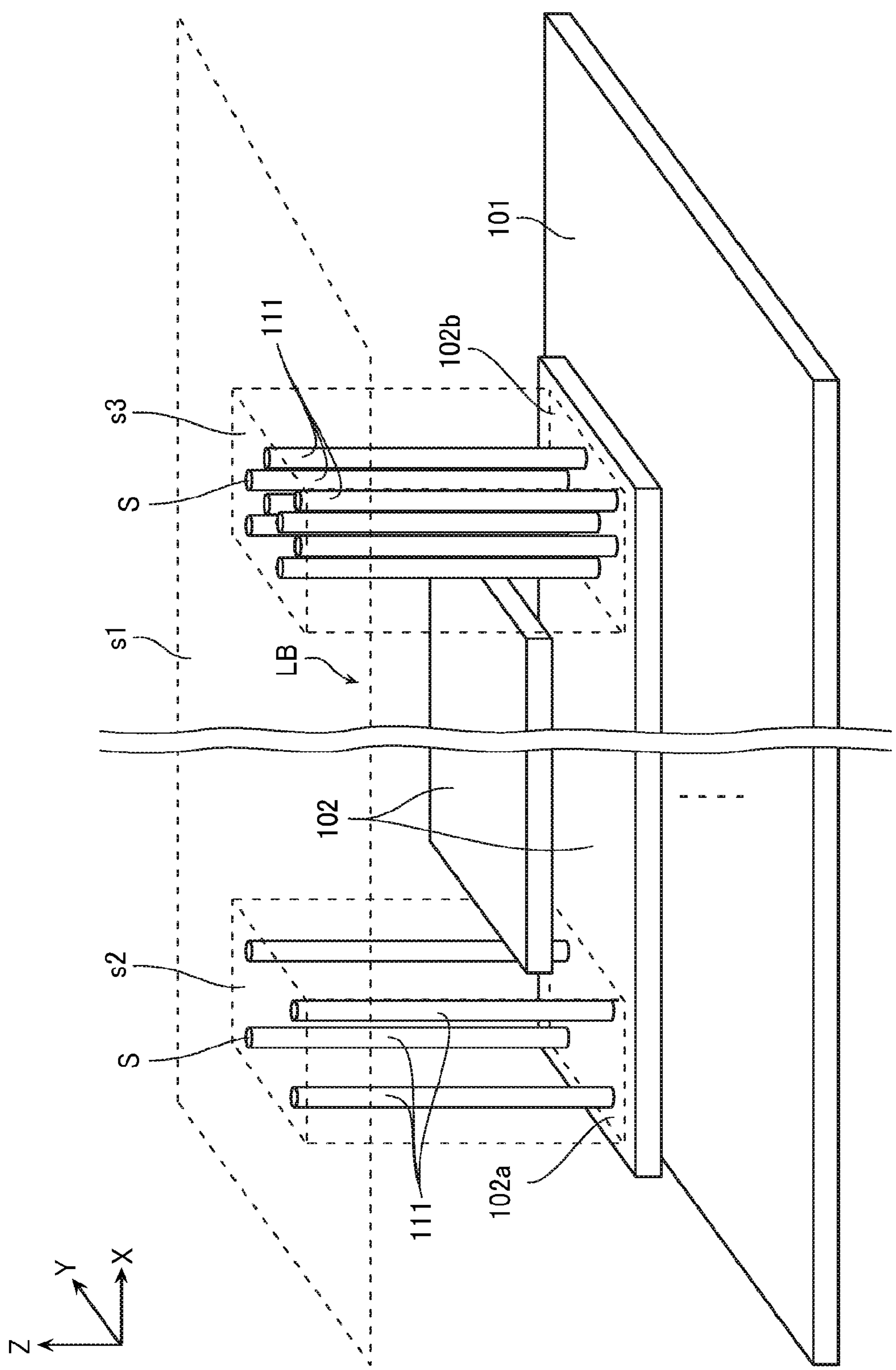
FIG. 14 is a perspective view showing a configuration of part of the same nonvolatile semiconductor memory device.

For example, the case where, as shown in FIG. 14, total area of the dummy structures 111 at a height of the upper surface of the uppermost layer conductive layer 102 in any small region 102*b* (if area of one dummy structure 111 is S, 8S in FIG. 14) is larger than total area of the dummy structures 111 at a height of the upper surface of the conductive layer 102 corresponding to any contact portion 102*a* (4S in FIG. 14).

Moreover, for example, the case where, as shown in FIG. 14, in a plane s1 parallel to the substrate 101, total area of the dummy structures 111 in a region s3 upward of the small region 102*b* (8S in FIG. 14) is larger than total area of the dummy structures 111 in a region s2 upward of the contact portion 102*a* (4S in FIG. 14). Note that in the example shown in FIG. 14, the region s2 has an area, planar shape, and position in the XY plane identical to those of the contact portion 102*a*. Moreover, the region s3 has an area, planar shape, and position in the XY plane identical to those of the small region 102*b*. Note that a height of the plane s1, region s2, and region s3 may be greater or less than that of the upper surface of the uppermost layer conductive layer 102. In other words, a certain height may be any height.

Furthermore, for example, the case where, similarly to in the present embodiment, the dummy structures 111 provided in the contact portion 102*a* and the dummy structures 111 provided in the small region 102*b* have equal cross-sectional areas at an identical height position (position in the Z direction), and the number of dummy structures 111 in the small region 102*b* (eight in the example shown in FIG. 14) is larger than the number of dummy structures 111 in the contact portion 102*a* (four in the example shown in FIG. 14). In this case, a height (position in the Z direction, distance from the substrate 101) of the contact portion 102*a* or small region 102*b* does not matter.

Furthermore, for example, the case where a distance between the dummy structures 111 in the small region 102*b* is smaller than a distance between the dummy structures 111 in the contact portion 102*a*.

[Second Embodiment]

Figure 15:
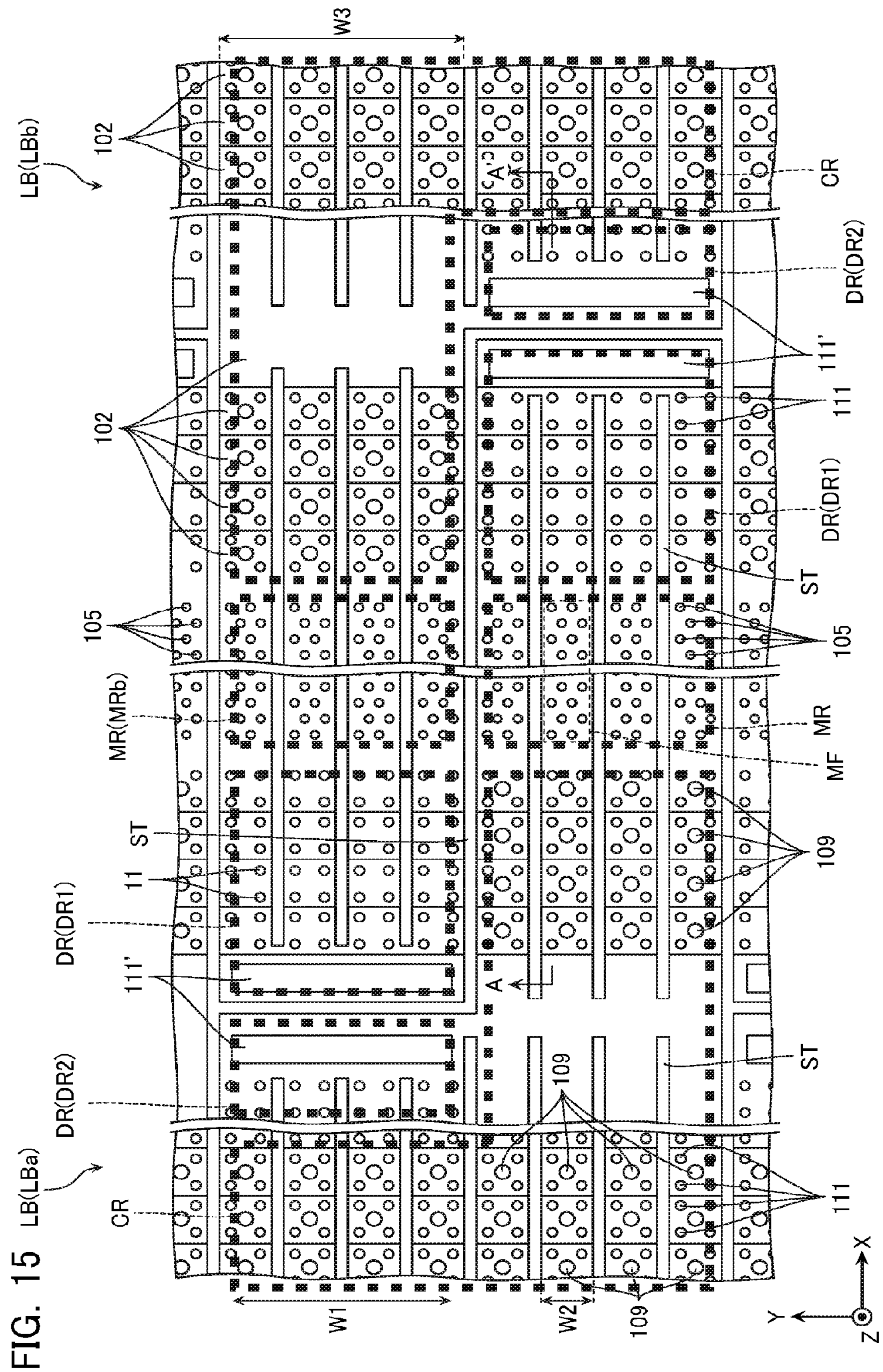
FIG. 15 is a plan view showing a configuration of part of a nonvolatile semiconductor memory device according to a second embodiment.
Figure 16:
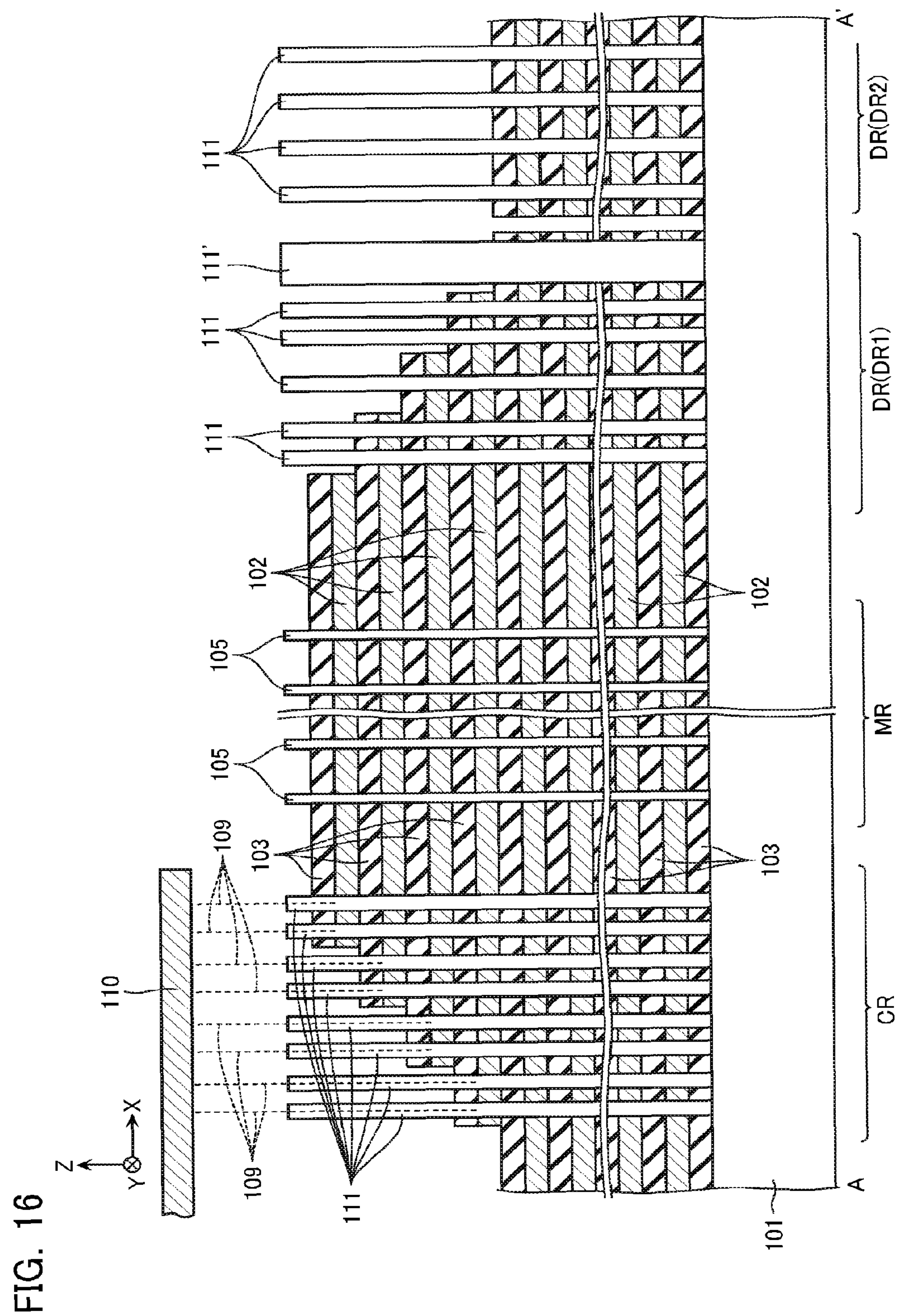
FIG. 16 is a cross-sectional view showing a configuration of part of the same nonvolatile semiconductor memory device.

Next, a configuration of a nonvolatile semiconductor memory device according to a second embodiment will be described with reference to FIGS. 15 and 16. FIG. 15 is a plan view for explaining the configuration of the same nonvolatile semiconductor memory device. FIG. 16 is a cross-sectional view of the same nonvolatile semiconductor memory device, and shows a cross-section of a portion corresponding to the line A-A' of FIG. 15. Note that in FIGS. 15 and 16, part of the configuration is omitted. Moreover, in the description below, portions similar to those of the first embodiment are assigned with reference symbols identical to those assigned in the first embodiment, and descriptions thereof will be omitted.

As shown in FIGS. 15 and 16, the nonvolatile semiconductor memory device according to the present embodiment is basically configured similarly to the nonvolatile semiconductor memory device according to the first embodiment, but a configuration in the dummy region DR is different.

That is, as shown in FIGS. 15 and 16, in the present embodiment, the dummy region DR is provided with a second dummy structure 111'. The second dummy structure 111' has the Y direction as its longitudinal direction, in the XY plane. Moreover, the dummy region DR, in addition to being provided with this second dummy structure 111', has the dummy structures 111 provided therein in a pattern similar to that of the contact region CR, and so on.

As shown in FIG. 15, the second dummy structure 111' has widths in the X direction and the Y direction which are larger compared to those of the memory columnar body 105 or dummy structure 111. In other words, an area in the XY plane of the second dummy structure 111' is larger than areas in the XY plane of the memory columnar body 105 or dummy structure 111. Moreover, a width W1 in the Y direction of the second dummy structure 111' is larger than a width W2 in the Y direction of the memory finger MF and is smaller than a width W3 of the conductive layer 102 (stacked body LB) in the memory region MR. Note that in other respects, the second dummy structure 111' can be formed similarly to the dummy structure 111.

The second dummy structure 111' according to the present embodiment has widths in the X direction and the Y direction which are larger compared to those of the memory columnar body 105 or dummy structure 111, hence rigidity in the X direction and the Y direction is stronger compared to that of the dummy structure 111 provided in the contact region CR, and so on. In particular, the second dummy structure 111' has the Y direction as its longitudinal direction, and can suitably suppress internal stress acting in the Y direction.

[Third Embodiment]

Figure 17:
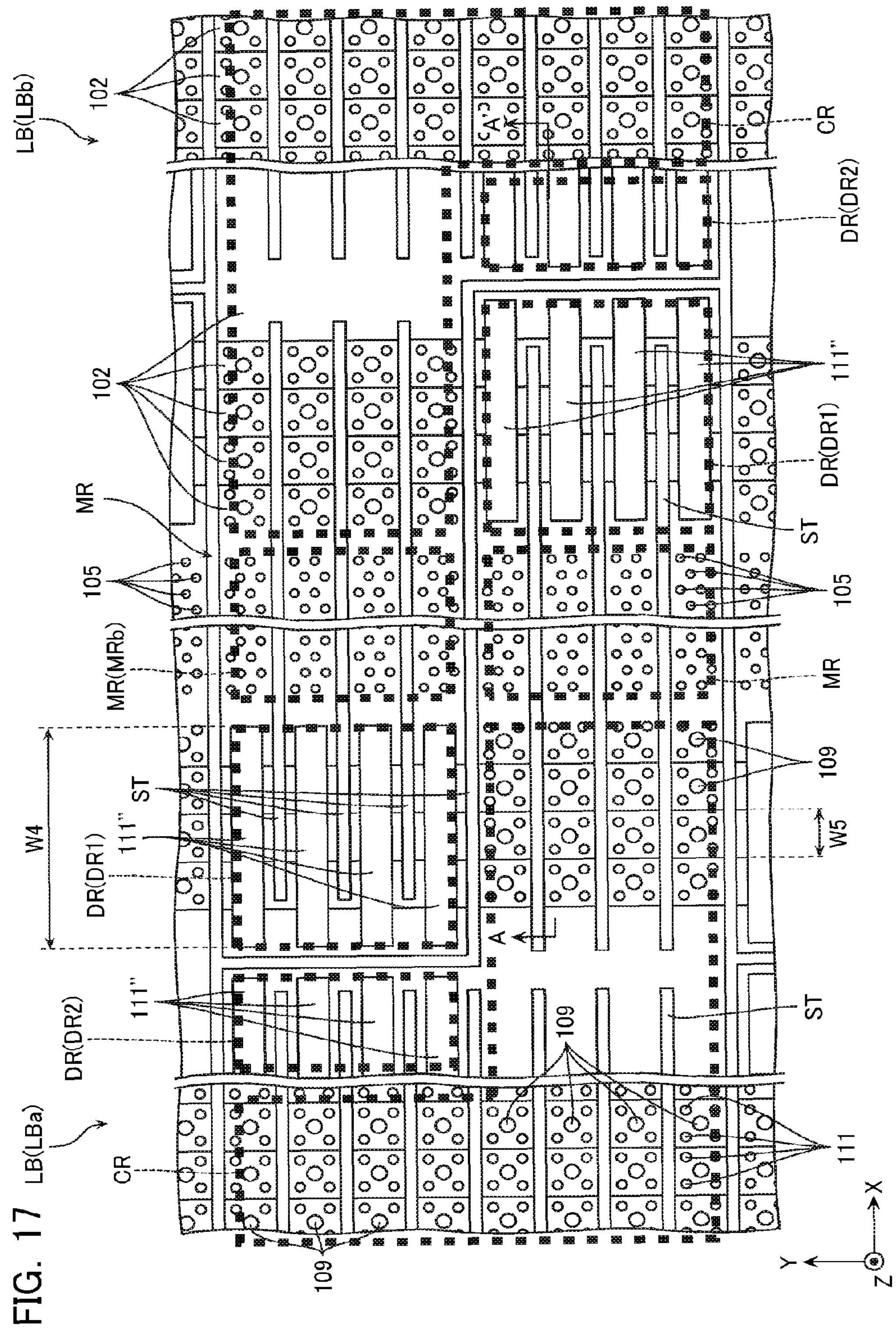
FIG. 17 is a plan view showing a configuration of part of a nonvolatile semiconductor memory device according to a third embodiment.
Figure 18:
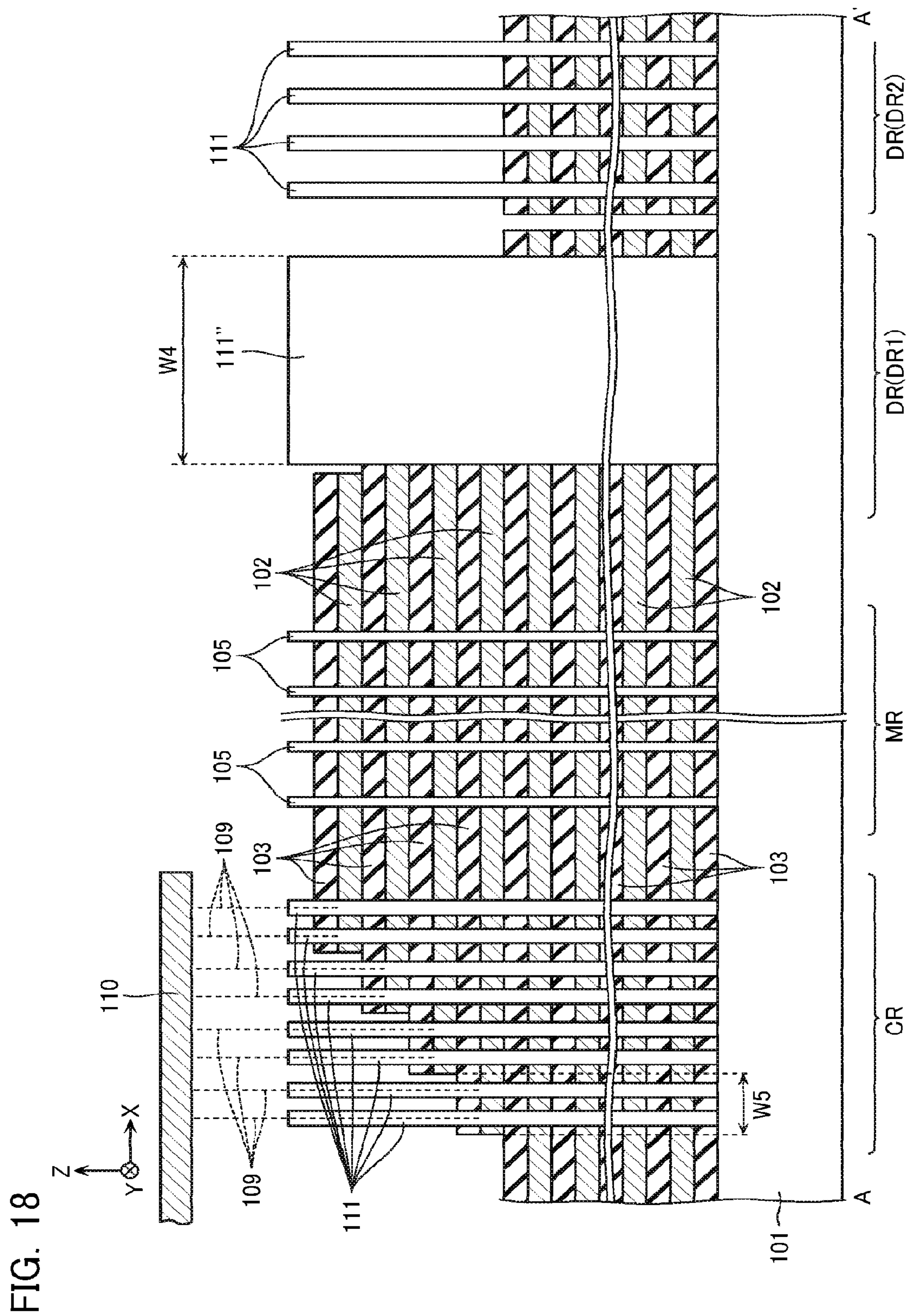
FIG. 18 is a cross-sectional view showing a configuration of part of the same nonvolatile semiconductor memory device.

Next, a configuration of a nonvolatile semiconductor memory device according to a third embodiment will be described with reference to FIGS. 17 and 18. FIG. 17 is a plan view for explaining the configuration of the same nonvolatile semiconductor memory device. FIG. 18 is a cross-sectional view of the same nonvolatile semiconductor memory device, and shows a cross-section of a portion corresponding to the line A-A' of FIG. 17. Note that in FIGS. 17 and 18, part of the configuration is omitted. Moreover, in the description below, portions similar to those of the first embodiment are assigned with reference symbols identical to those assigned in the first embodiment, and descriptions thereof will be omitted.

As shown in FIGS. 17 and 18, the nonvolatile semiconductor memory device according to the present embodiment is basically configured similarly to the nonvolatile semiconductor memory device according to the first embodiment, but a configuration in the dummy region DR is different.

That is, as shown in FIGS. 17 and 18, in the present embodiment, the dummy region DR is provided with a third dummy structure 111". The third dummy structure 111" has the X direction as its longitudinal direction, in the XY plane. Moreover, a plurality of the third dummy structures 111" are provided in the Y direction via the slit ST.

As shown in FIG. 17, the third dummy structure 111" has widths in the X direction and the Y direction which are larger compared to those of the memory columnar body 105 or dummy structure 111. In other words, an area in the XY plane of the third dummy structure 111" is larger than areas in the XY plane of the memory columnar body 105 or dummy structure 111. Moreover, a width W4 in the X direction of the third dummy structure 111" is larger than a width W5 in the X direction of the contact portion 102*a* of the conductive layer 102. Note that in other respects, the third dummy structure 111" can be formed similarly to the dummy structure 111.

The third dummy structure 111" according to the present embodiment has widths in the X direction and the Y direction which are larger compared to those of the memory columnar body 105 or dummy structure 111, hence rigidity in the X direction and the Y direction is stronger compared to that of the dummy structure 111 provided in the contact region CR, and so on. In particular, the third dummy structure 111" has the X direction as its longitudinal direction, and can suitably suppress internal stress acting in the X direction.

[Fourth Embodiment]

Figure 19:
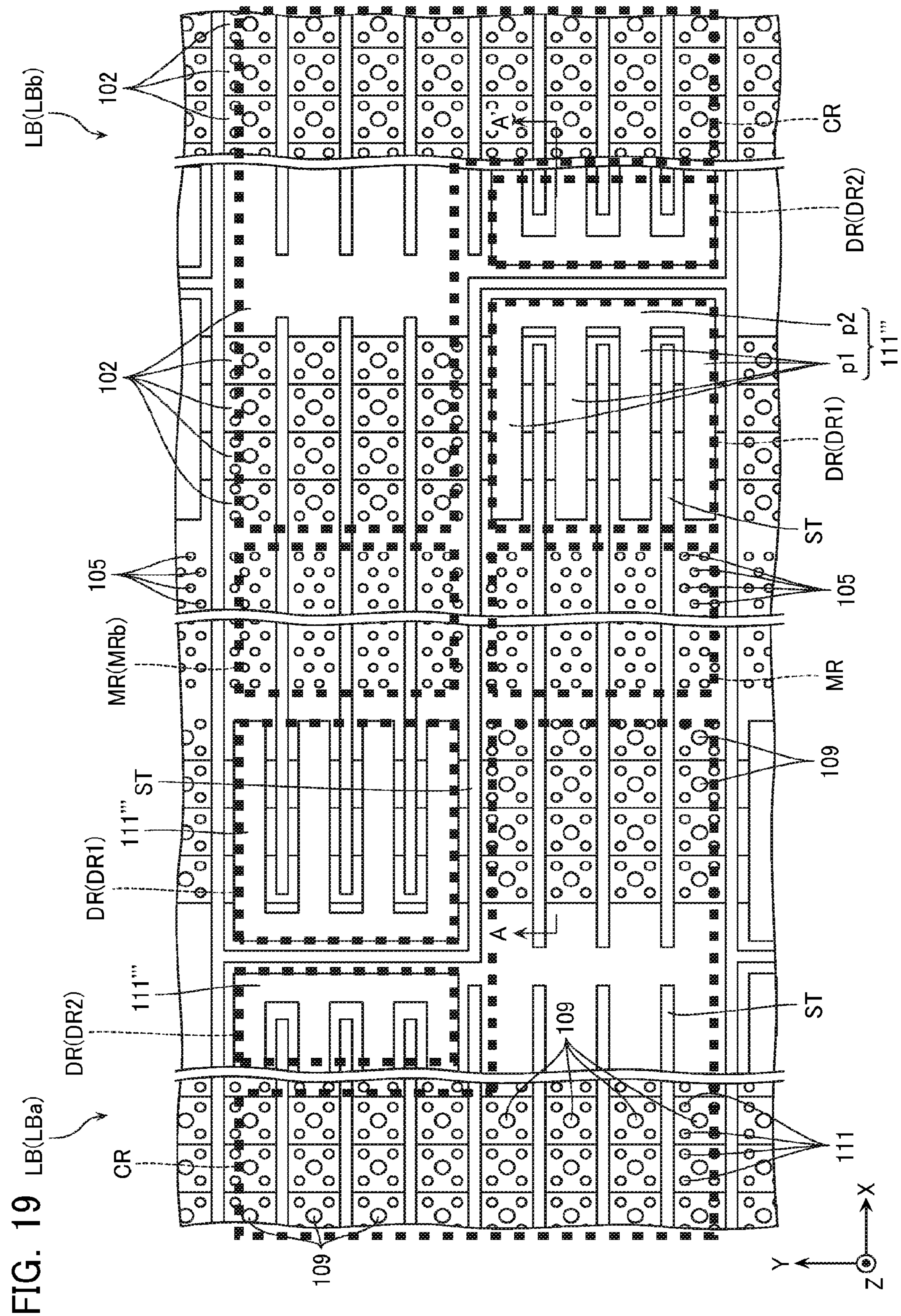
FIG. 19 is a plan view showing a configuration of part of a nonvolatile semiconductor memory device according to a fourth embodiment.

Next, a configuration of a nonvolatile semiconductor memory device according to a fourth embodiment will be described with reference to FIG. 19. FIG. 19 is a plan view for explaining the configuration of the same nonvolatile semiconductor memory device. Note that in FIG. 19, part of the configuration is omitted. Moreover, in the description below, portions similar to those of the first embodiment are assigned with reference symbols identical to those assigned in the first embodiment, and descriptions thereof will be omitted.

As shown in FIG. 19, the nonvolatile semiconductor memory device according to the present embodiment is basically configured similarly to the nonvolatile semiconductor memory device according to the first embodiment, but a configuration in the dummy region DR is different.

That is, as shown in FIG. 19, in the present embodiment, the dummy region DR is provided with a fourth dummy structure 111'" having a comb shape. That is, the fourth dummy structure 111'" comprises: a plurality of first portions p1 having the X direction as their longitudinal direction in the XY plane and provided in the Y direction; and a second portion p2 having the Y direction as its longitudinal direction in the XY plane and connected to the plurality of first portions p1. The first portion p1 is configured substantially similarly to the third dummy structure 111" described with reference to FIG. 17, and so on. Moreover, the second portion p2 is configured substantially similarly to the second dummy structure 111' described with reference to FIG. 15, and so on.

The fourth dummy structure 111'" according to the present embodiment has widths in the X direction and the Y direction which are larger compared to those of the memory columnar body 105 or dummy structure 111, hence rigidity in the X direction and the Y direction is stronger compared to that of the dummy structure 111 provided in the contact region CR, and so on. Moreover, the fourth dummy structure 111''' comprises: the first portion p1 having the X direction as its longitudinal direction; and the second portion p2 having the Y direction as its longitudinal direction, hence can suitably suppress internal stresses acting in both the X direction and the Y direction.

[Fifth Embodiment]

Figure 20:
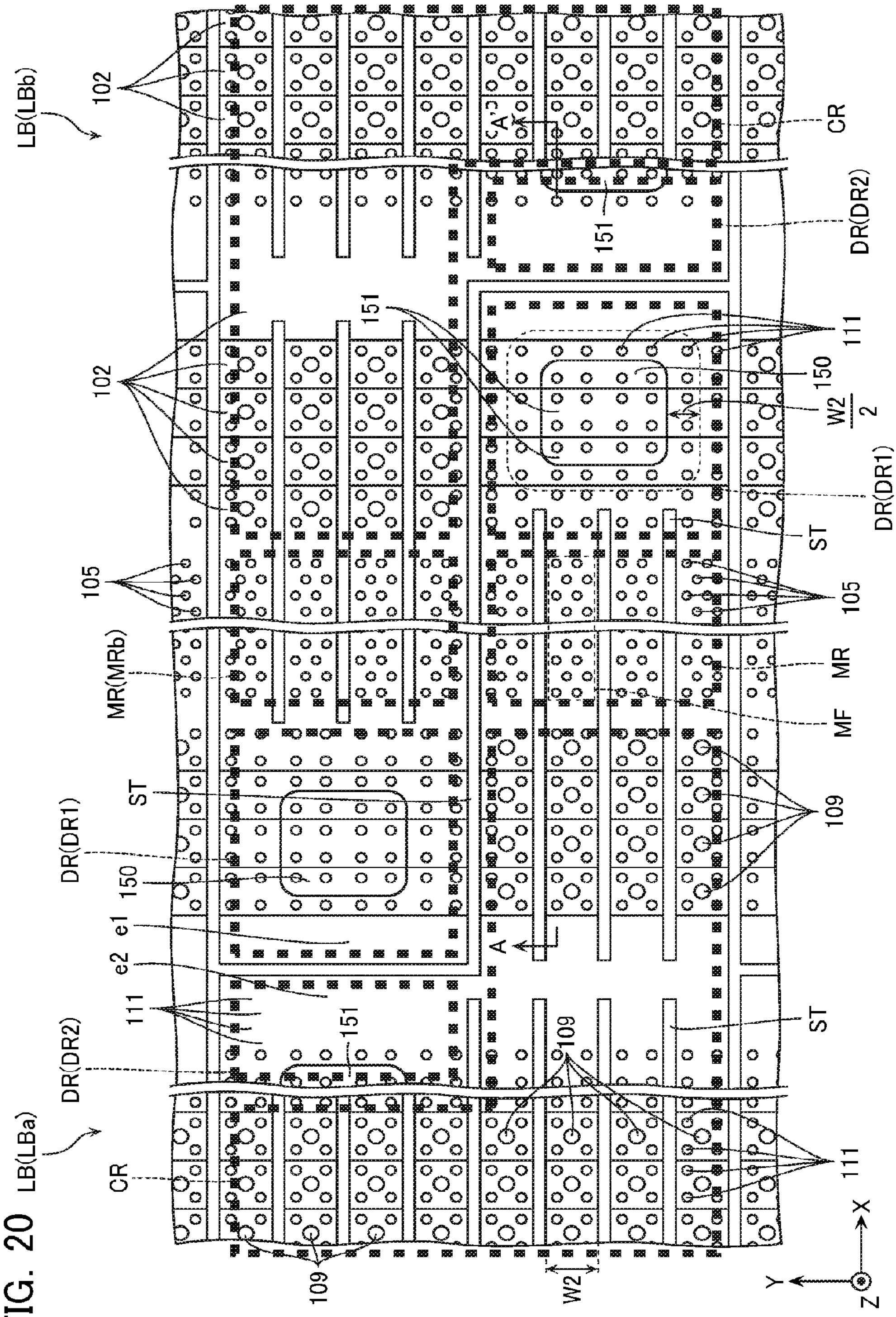
FIG. 20 is a plan view showing a configuration of part of a nonvolatile semiconductor memory device according to a fifth embodiment.
Figure 21:
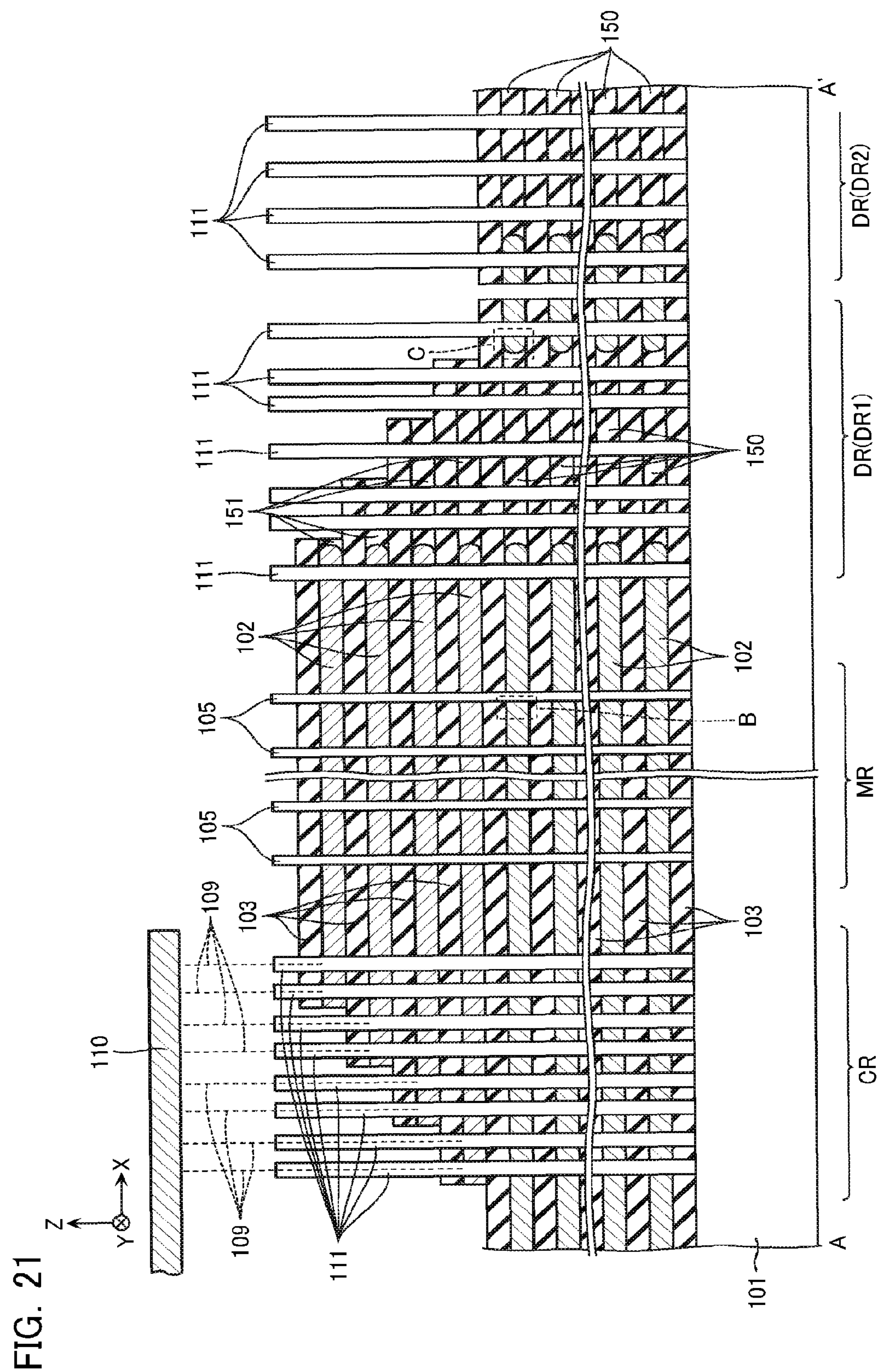
FIG. 21 is a cross-sectional view showing a configuration of part of the same nonvolatile semiconductor memory device.
Figure 22:
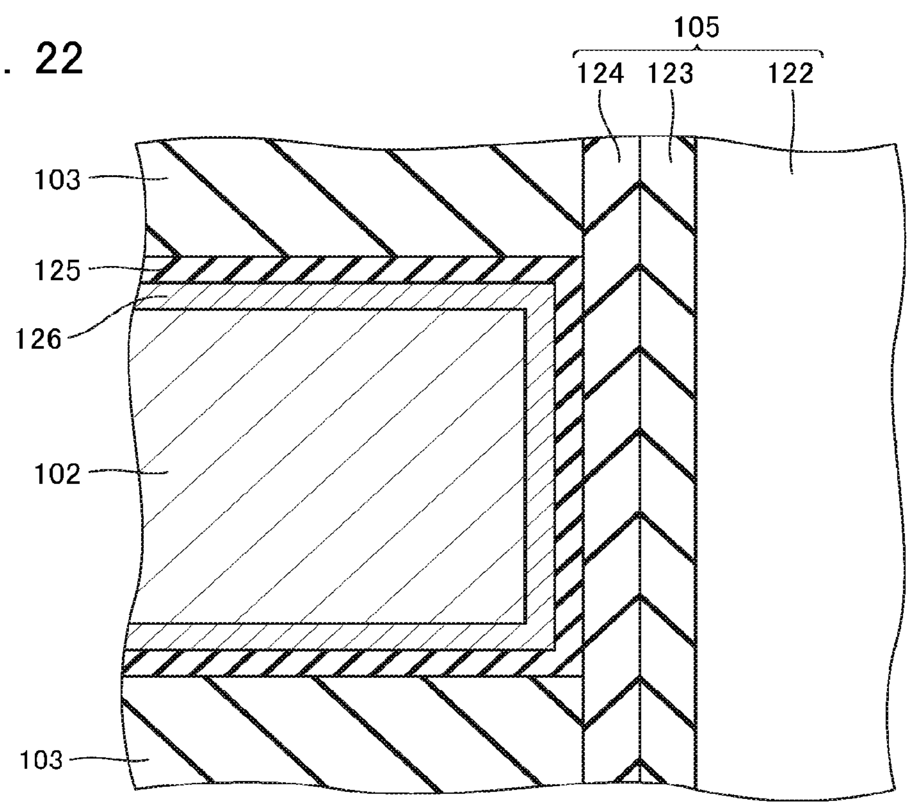
FIG. 22 is a cross-sectional view showing a configuration of part of the same nonvolatile semiconductor memory device.
Figure 23:
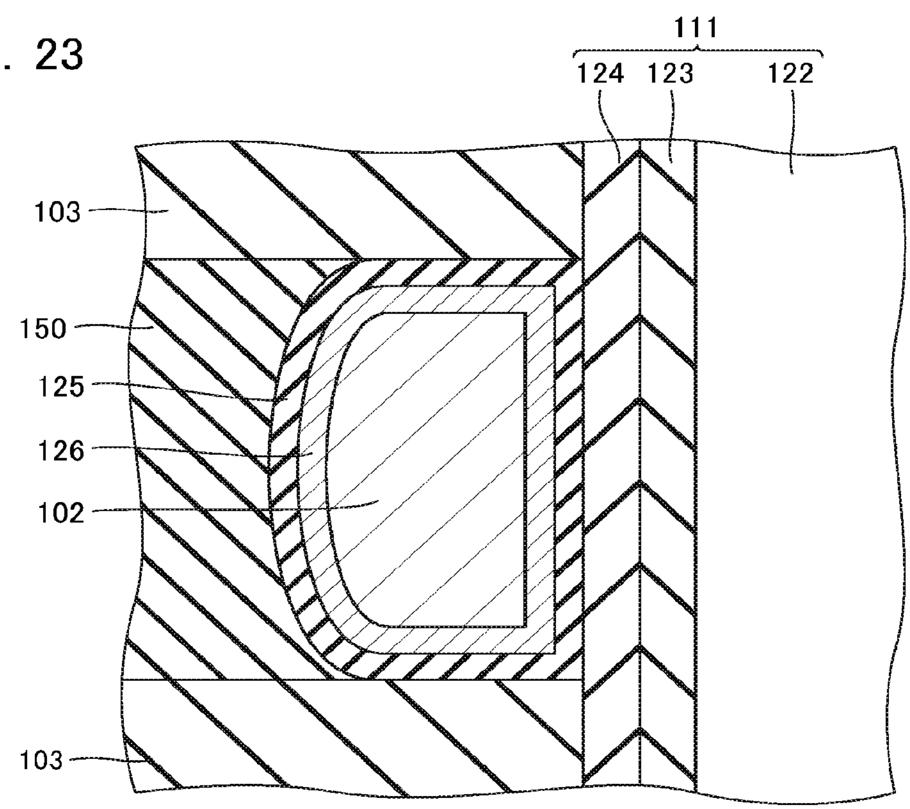
FIG. 23 is a cross-sectional view showing a configuration of part of the same nonvolatile semiconductor memory device.
Figure 24:
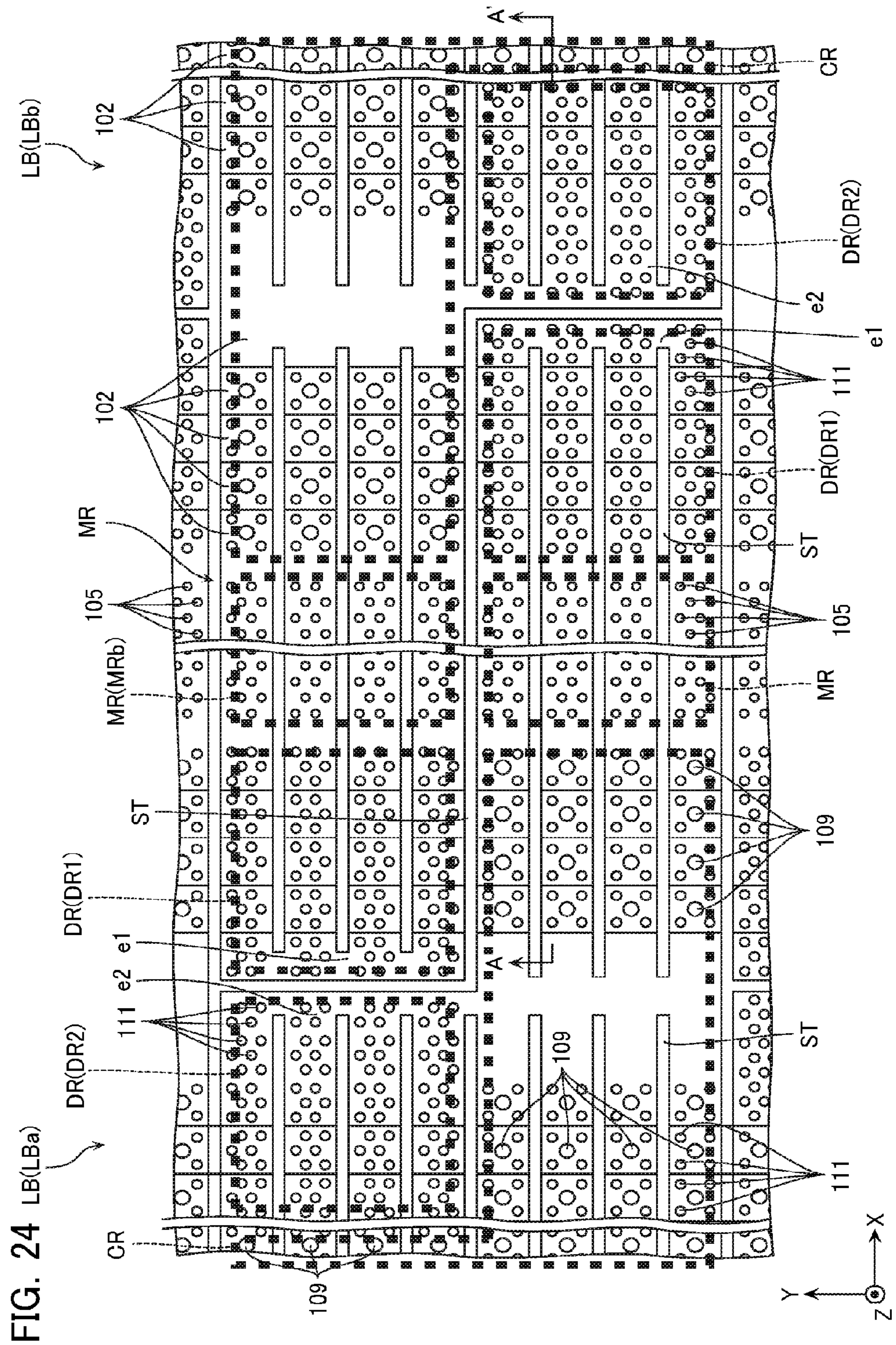
FIG. 24 is a plan view showing a configuration of part of a nonvolatile semiconductor memory device according to another embodiment.
Figure 25:
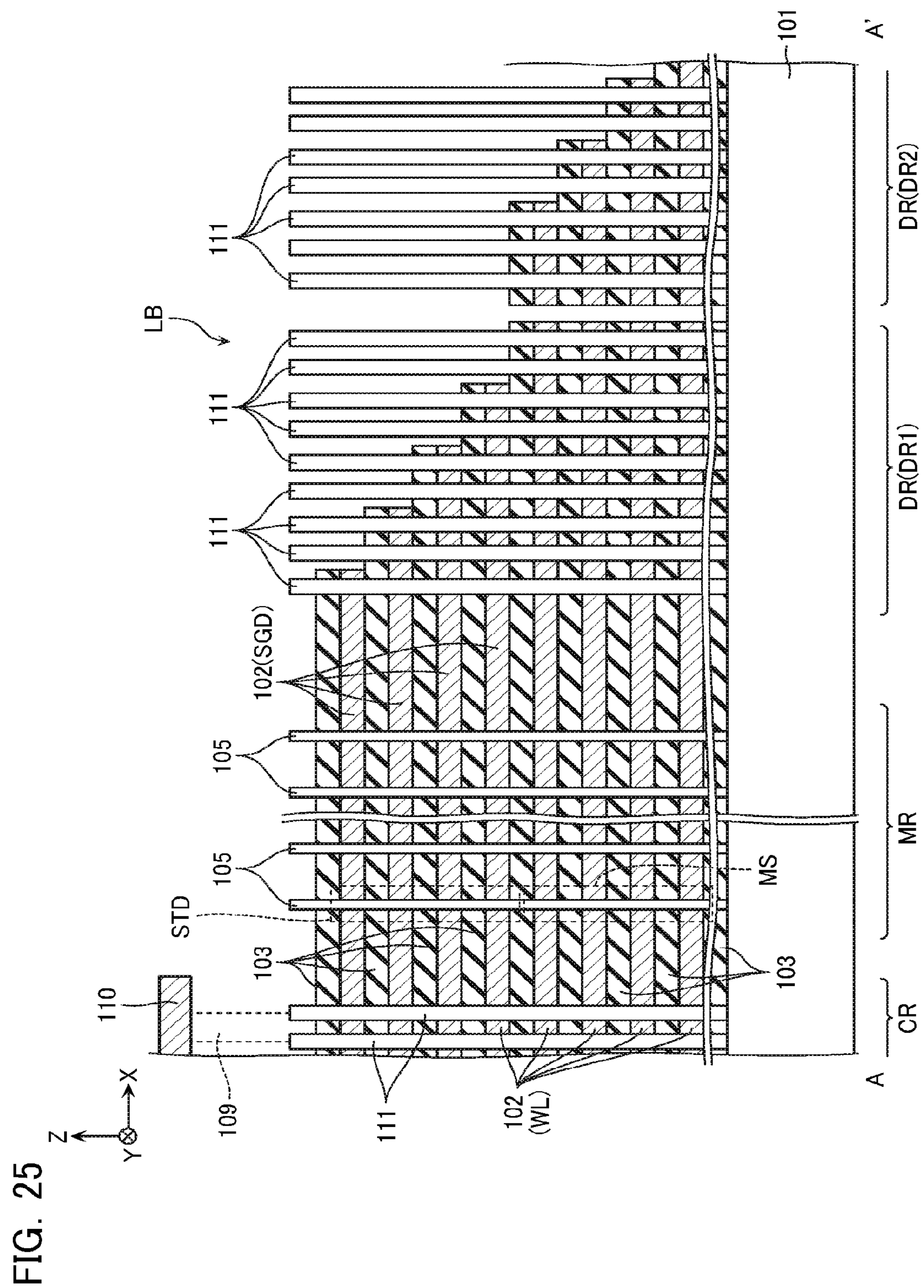
FIG. 25 is a cross-sectional view showing a configuration of part of the same nonvolatile semiconductor memory device.
Figure 26:
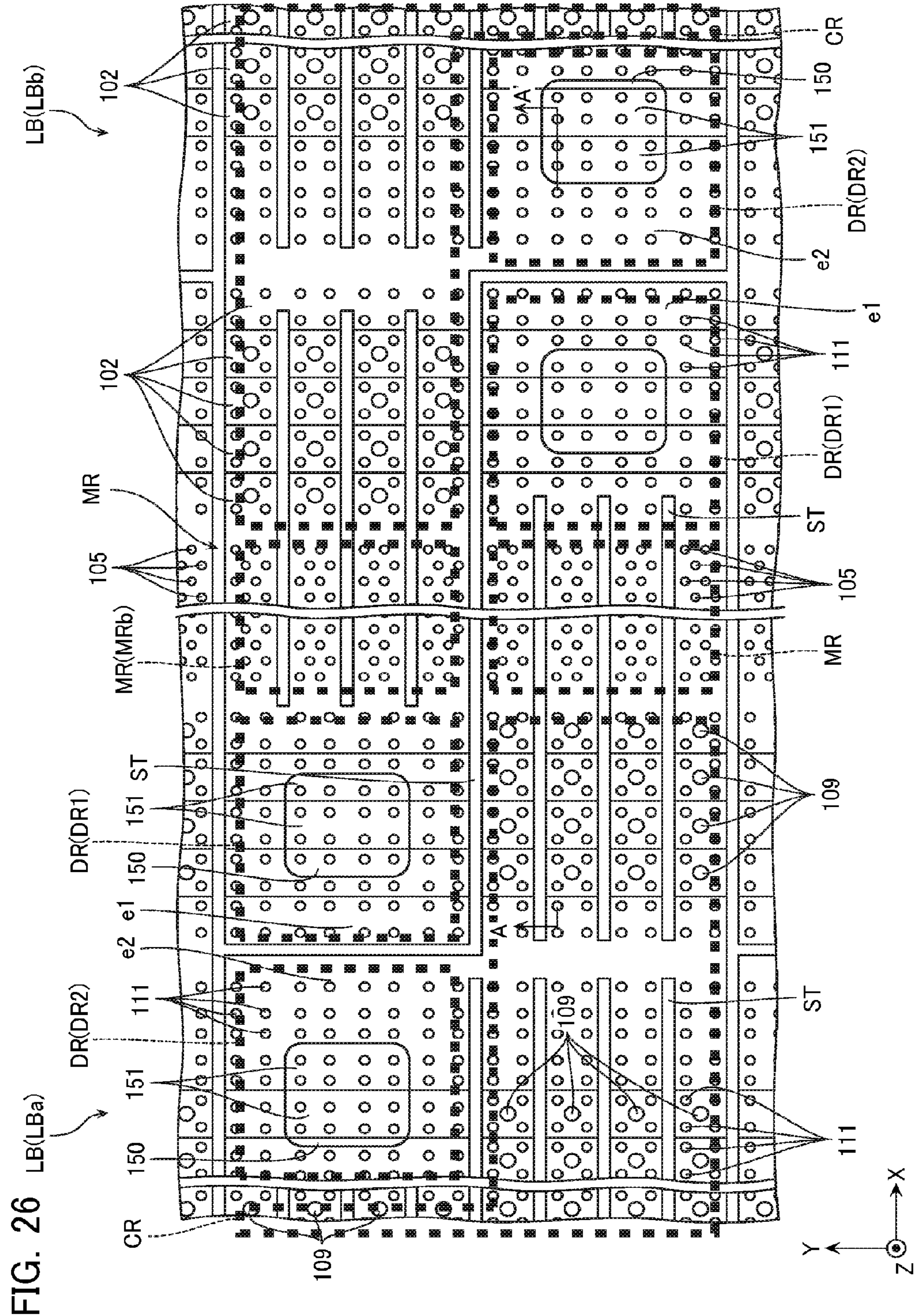
FIG. 26 is a plan view showing a configuration of part of a nonvolatile semiconductor memory device according to another embodiment.
Figure 27:
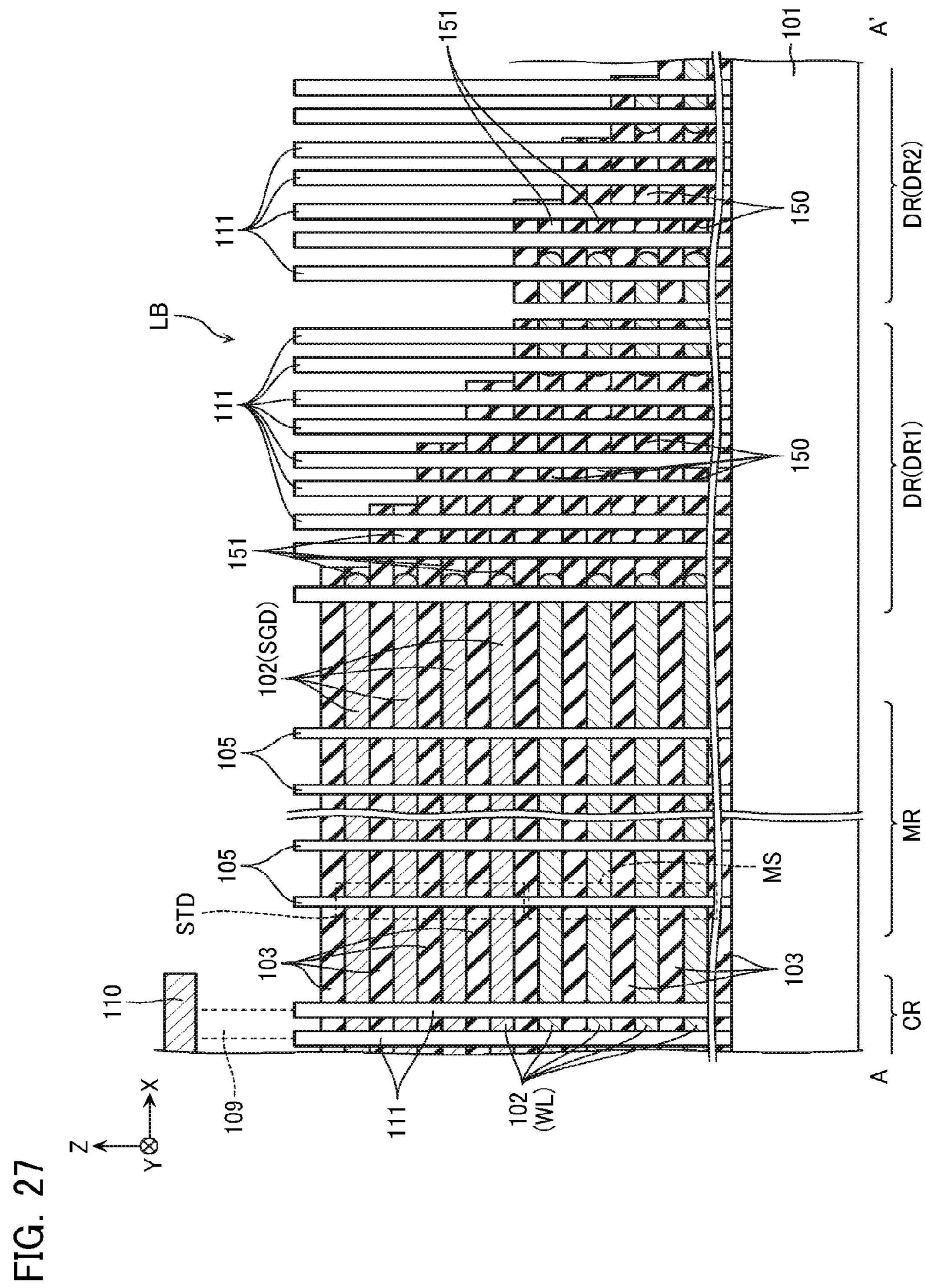
FIG. 27 is a cross-sectional view showing a configuration of part of the same nonvolatile semiconductor memory device.

Next, a configuration of a nonvolatile semiconductor memory device according to a fifth embodiment will be described with reference to FIGS. 20 to 23. FIG. 20 is a plan view for explaining the configuration of the same nonvolatile semiconductor memory device. FIG. 21 is a cross-sectional view of the same nonvolatile semiconductor memory device, and shows a cross-section of a portion corresponding to the line A-A' of FIG. 20. FIGS. 22 and 23 are cross-sectional views of the same nonvolatile semiconductor memory device, and respectively show, enlarged, portions indicated by B and C of FIG. 21. Note that in FIGS. 20 and 21, part of the configuration is omitted. Moreover, in the description below, portions similar to those of the first embodiment are assigned with reference symbols identical to those assigned in the first embodiment, and descriptions thereof will be omitted.

As shown in FIGS. 20 and 21, the nonvolatile semiconductor memory device according to the present embodiment is basically configured similarly to the nonvolatile semiconductor memory device according to the first embodiment, but a configuration in the dummy region DR is different.

That is, as shown in FIG. 20, in the present embodiment, the dummy region DR is provided with the dummy structure 111 in a pattern similar to that of the contact region CR, and so on.

Moreover, as shown in FIG. 20, in the present embodiment, the dummy region DR is provided with an insulating layer 150. The insulating layer 150 is formed from the likes of silicon nitride ($Si_3N_4$), for example, and as shown in FIG. 21, is stacked via the inter-layer insulating layer 103 formed from silicon oxide ($SiO_2$), for example. Moreover, this insulating layer 150 has its side surfaces in the X direction and the Y direction covered by the conductive layer 102.

In addition, as shown in FIG. 21, in the present embodiment, a plurality of insulating layers 151 are provided upwardly of the insulating layer 150 in the dummy region DR. The insulating layer 151 is basically configured similarly to the insulating layer 150, and is stacked via the inter-layer insulating layer 103 formed in a stepped shape. However, one end in the X direction of the insulating layer 151 is positioned in a portion corresponding to a side surface of a stepped structure of the stacked body LB. In other words, the end in the X direction of the insulating layer 151 protrudes in the X direction with respect to the insulating layer 151 positioned in a layer above. Note that in other respects, the insulating layer 151 is configured similarly to the insulating layer 150.

Such a configuration can be manufactured by a method substantially similar to that of the nonvolatile semiconductor memory device according to the first embodiment, for example. However, in the case of manufacturing the nonvolatile semiconductor memory device according to the present embodiment, it is only required that the dummy region DR is not provided with the slit ST, or that a length of the slit ST provided in the dummy region DR is reduced. That is, in the step described with reference to FIG. 9, the likes of wet etching using phosphoric acid is performed via the slit ST, and the sacrifice layer 141 is removed. However, when the dummy region DR is not provided with the slit ST or the length of the slit ST provided in the dummy region DR is reduced, the sacrifice layer 141 remains unremoved in a portion separated from the slit ST in the dummy region DR, and becomes the insulating layer 150 according to the present embodiment.

In such a mode, the sacrifice layer 141 remains unremoved in the dummy region DR, hence even when part of the sacrifice layer 141 is removed, the inter-layer insulating layer 103 is suitably supported by the remaining sacrifice layer 141, whereby deformation can be suppressed. Moreover, even when internal stress has occurred due to thermal contraction of the conductive layer 102, the conductive layer 102 or inter-layer insulating layer 103 can be supported by this sacrifice layer 141 and the plurality of dummy structures 111, and deformation by internal stress of these layers can be suppressed.

Note that even in the present embodiment, in the step described with reference to FIG. 9, the sacrifice layer 141 is all removed in the memory region MR, and so on. Therefore, as shown in FIG. 20, if a width in the Y direction of the memory finger MF is assumed to be W2, then even in the dummy region DR, the sacrifice layer 141 is removed in at least a range of W2/2 from the slit ST. In other words, as shown in FIG. 20, the slit ST is not provided in a range of W2/2 from the insulating layer 150.

Moreover, even in the present embodiment, in the step described with reference to FIG. 8, the conductive layer 102 configured from the likes of tungsten (W), the block insulating layer configured from the likes of silicon oxide ($SiO_2$), and the barrier metal layer configured from the likes of titanium nitride (TiN) are deposited on the upper surface and lower surface of the inter-layer insulating layer 103 and on a sidewall portion of the memory columnar body 105. As a result, as shown in FIG. 22, a barrier metal layer 126 configured from the likes of titanium nitride (TiN) is formed between the memory columnar body 105 and the conductive layer 102. Furthermore, the block insulating layer 125 configured from the likes of silicon oxide ($SiO_2$) is formed between the memory columnar body 105 and the barrier metal layer 126.

Now, in the present embodiment, in the step described with reference to FIG. 8, the conductive layer 102 configured from the likes of tungsten (W), the block insulating layer configured from the likes of silicon oxide ($SiO_2$), and the barrier metal layer configured from the likes of titanium nitride (TiN) are deposited not only on the sidewall portion of the memory columnar body 105 but also on a sidewall portion of the remaining sacrifice layer 141 (insulating layer 150). Therefore, as shown in FIG. 23, the barrier metal layer 126 configured from the likes of titanium nitride (TiN) is formed between the insulating layer 150 and the conductive layer 102. Furthermore, the block insulating layer 125 configured from the likes of silicon oxide ($SiO_2$) is formed between the barrier metal layer 126 and the insulating layer 150.

[Other Embodiments]

As described with reference to FIGS. 12 and 13, in the first through fifth embodiments, the stacked body LB was formed in a stepped shape in the first dummy region DR1, and the stacked body LB was not formed in a stepped shape in the second dummy region DR2. However, as shown in FIGS. 24 to 27, for example, the stacked body LB may be formed in a stepped shape not only in the first dummy region DR1 but also in the second dummy region DR2, or the stacked body LB need not be formed in a stepped shape in either of the first dummy region DR1 and the second dummy region DR2.

Figure 28:
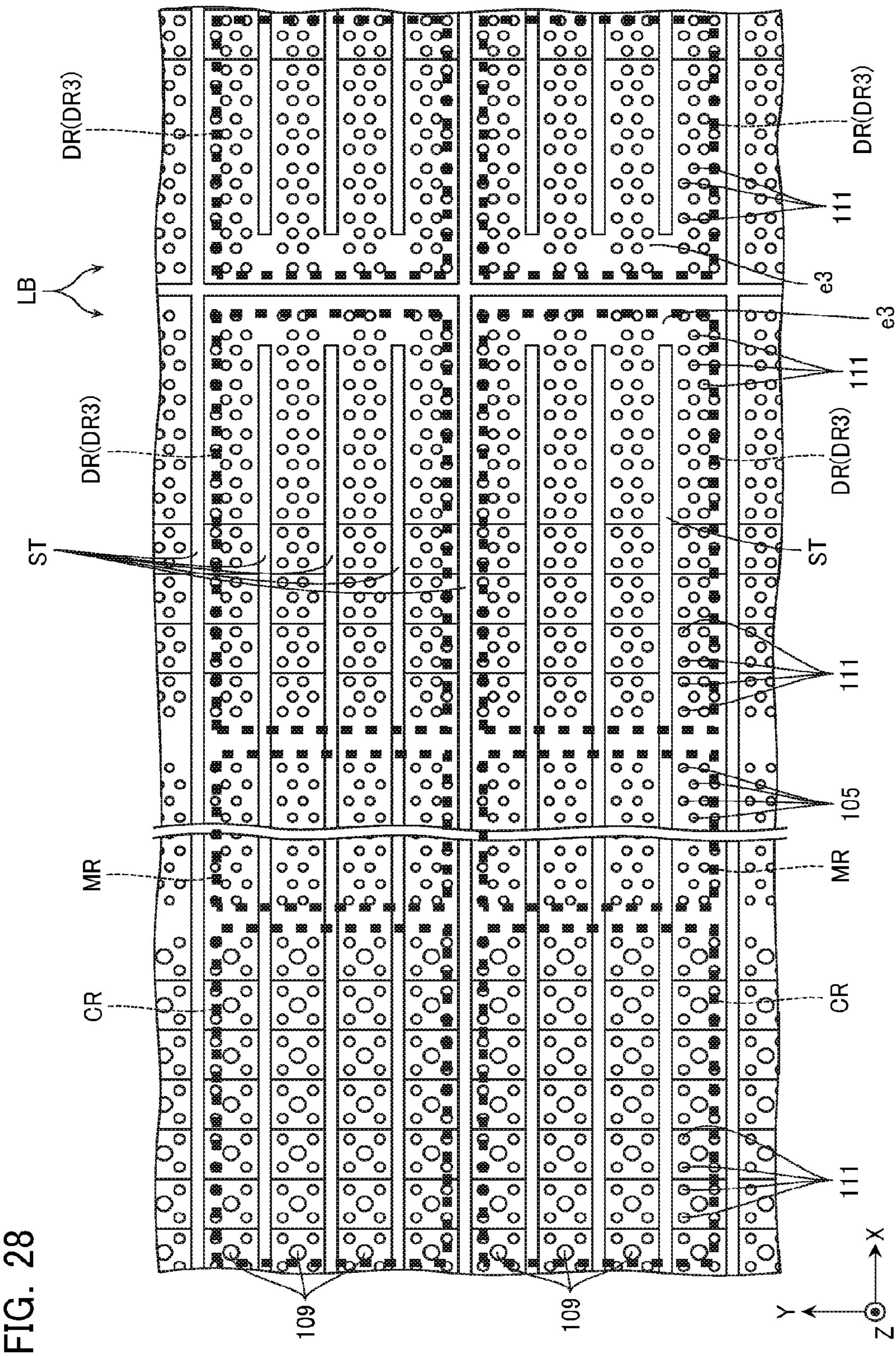
FIG. 28 is a plan view showing a configuration of part of a nonvolatile semiconductor memory device according to another embodiment.
Figure 29:
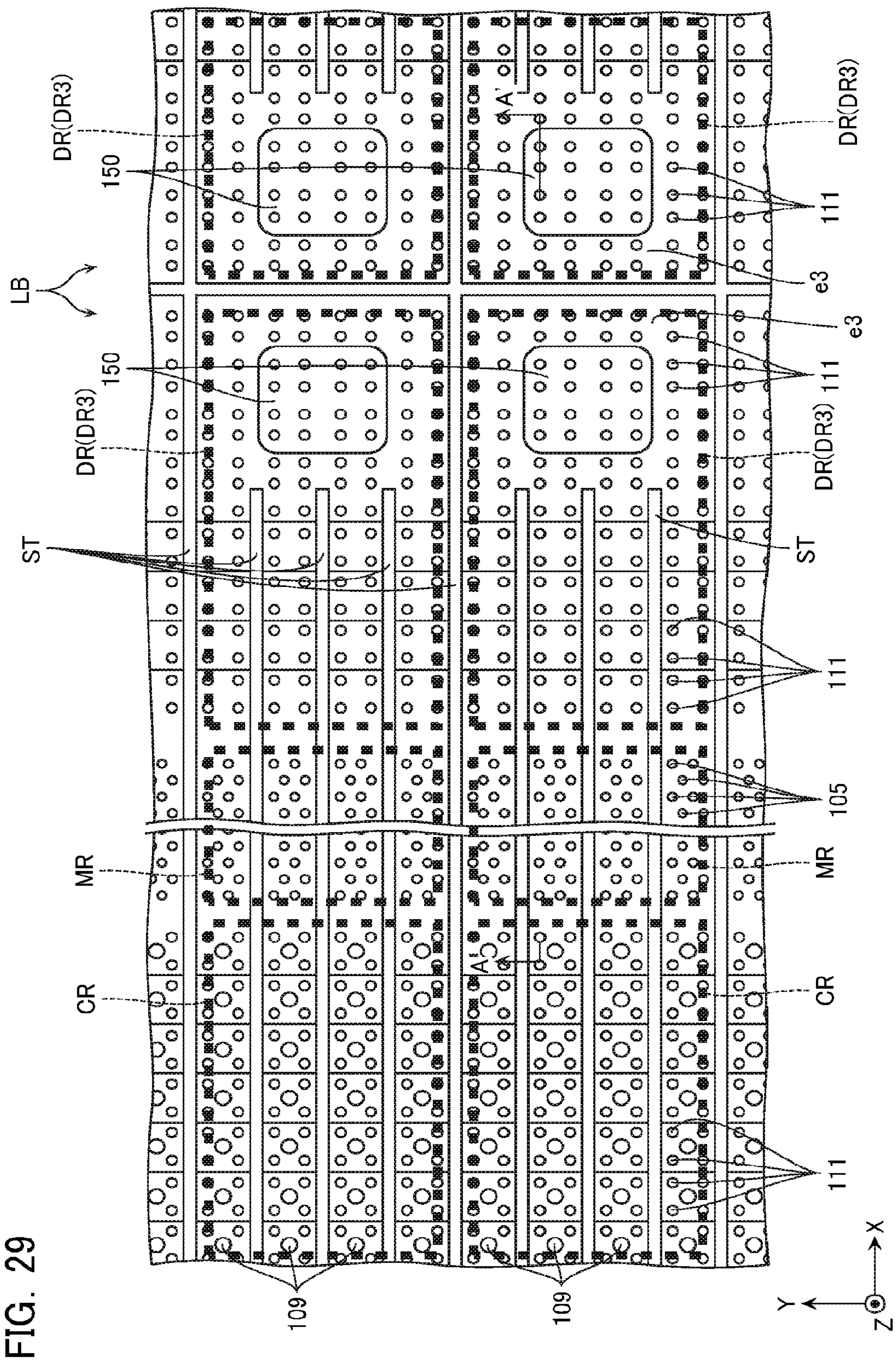
FIG. 29 is a plan view showing a configuration of part of a nonvolatile semiconductor memory device according to another embodiment.
Figure 30:
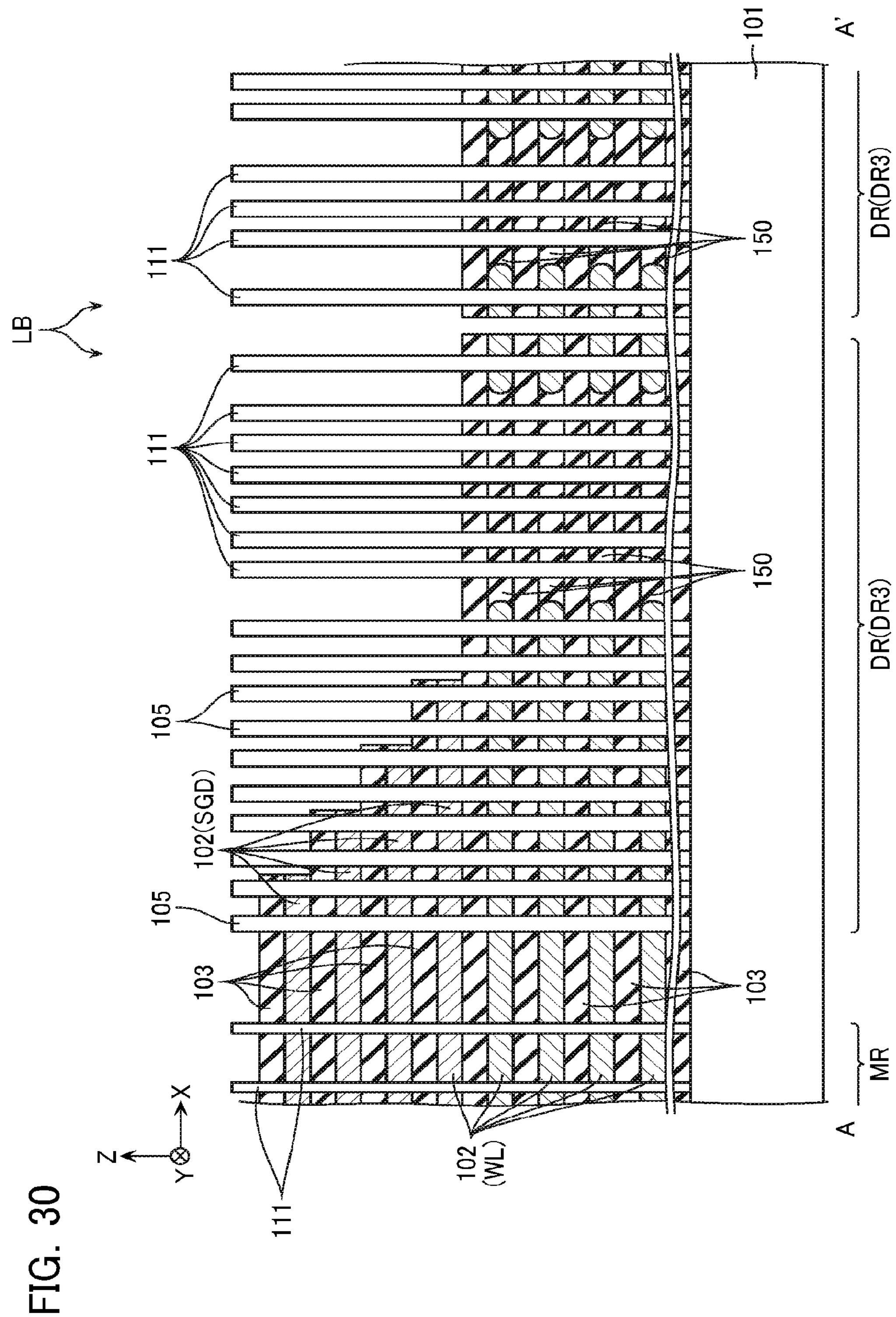
FIG. 30 is a cross-sectional view showing a configuration of part of the same nonvolatile semiconductor memory device.

In addition, as described with reference to FIG. 11, in the first through fifth embodiments, the stacked body LB had substantially an L shape having the X direction as its longitudinal direction. However, as shown in FIGS. 28 to 30, for example, the stacked body LB may comprise a rectangular (linear) shape having the X direction as its longitudinal direction. In such a case, for example, a dummy region DR3 may be provided with an end e3 in the X direction of the stacked body LB. Moreover, as shown in FIG. 28, the area of the dummy structures 111 per unit area in this dummy region DR3 may be larger than the area of the dummy structures 111 per unit area in the contact region CR. Moreover, as shown in FIGS. 29 and 30, this dummy region DR3 may be provided with the insulating layer 150 in a mode similar to that of the fifth embodiment described with reference to FIGS. 20 and 21.

Figure 31:
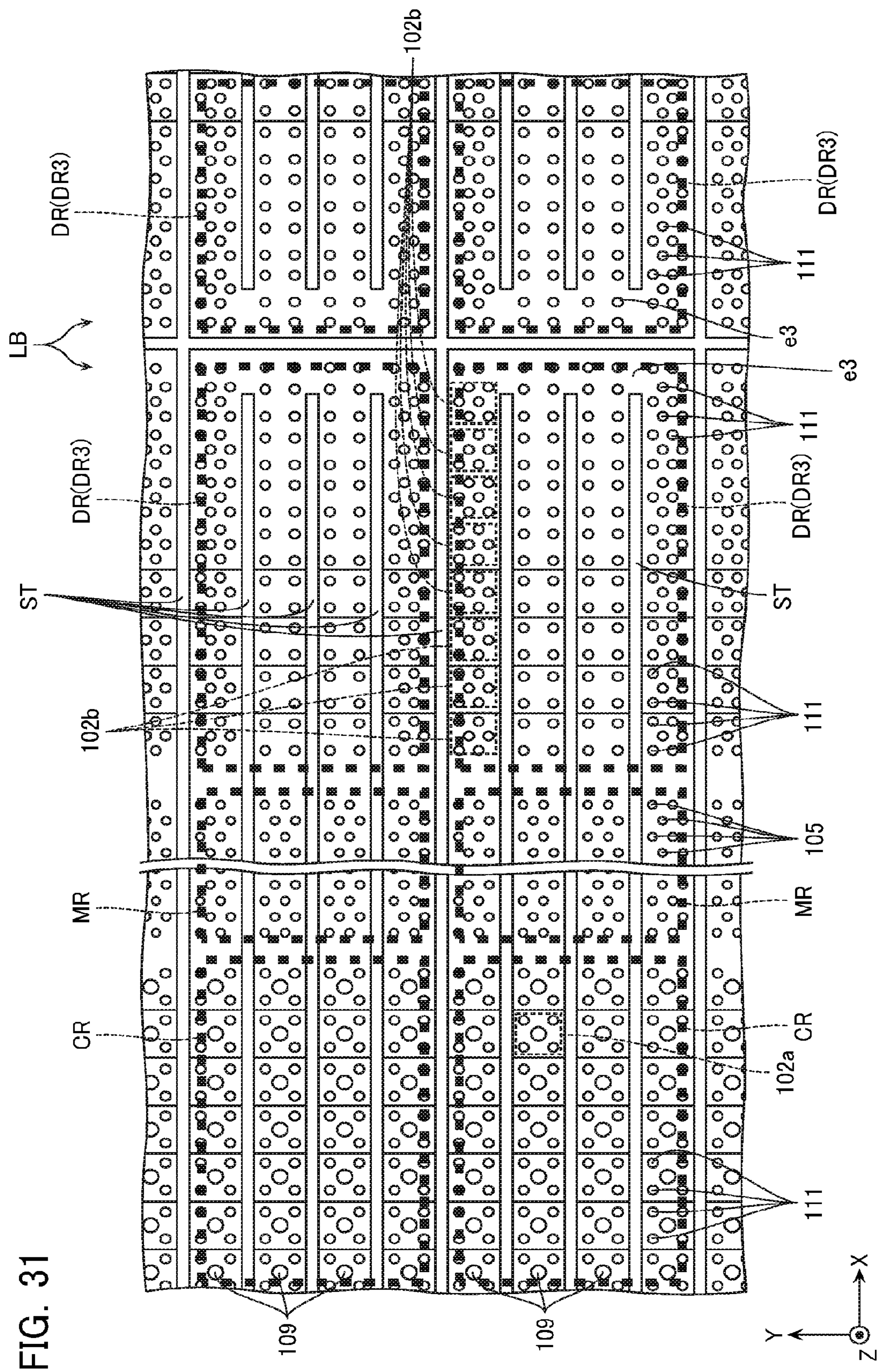
FIG. 31 is a plan view showing a configuration of part of a nonvolatile semiconductor memory device according to another embodiment.

Moreover, in the first embodiment, the dummy structures 111 were provided substantially uniformly in the dummy region DR. However, as described with reference to FIG. 12, for example, it is also possible for the dummy structures 111 to be provided intensively in the likes of a portion where internal stress of the conductive layer 102 or inter-layer insulating layer 103 will be particularly strong, for example, a portion close to the slit ST in particular. For example, as shown in FIG. 31, a plurality of the small regions 102*b* configured such that their total area of the dummy structures 111 is larger than that of the contact portion 102*a*, may be provided along an end in the XY plane of the stacked body LB. In the example shown in FIG. 31, a plurality of the small regions 102*b* aligned in the X direction are provided along an end in the Y direction of the stacked body LB. Moreover, two of the stacked bodies LB adjacent in the Y direction via the slit ST are each provided with a plurality of the small regions 102*b*, and the plurality of small regions 102*b* provided in one of the stacked bodies LB are adjacent from the Y direction via the slit ST, to the plurality of small regions 102*b* provided in the other of the stacked bodies LB.

Figure 32:
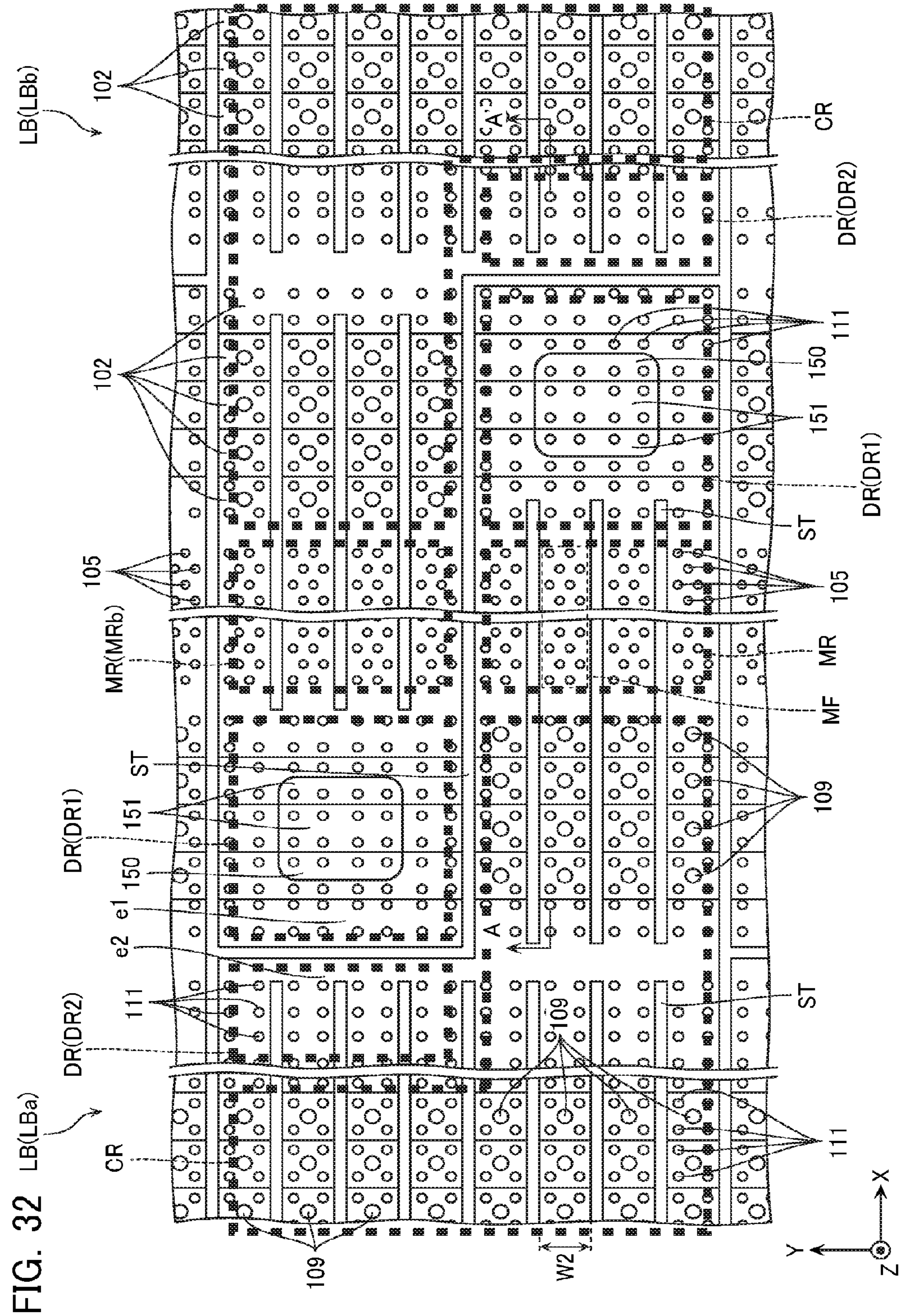
FIG. 32 is a plan view showing a configuration of part of a nonvolatile semiconductor memory device according to another embodiment.

Moreover, in the first through fifth embodiments, both of the first dummy region DR1 and the second dummy region DR2 had the area of the dummy structures 111 per unit area larger than in the contact region CR, or both of the first dummy region DR1 and the second dummy region DR2 were provided with the insulating layer 150 or insulating layer 151. However, for example, as shown in FIG. 32, it is possible for only one of the first dummy region DR1 and the second dummy region DR2 to have the area of the dummy structures 111 per unit area made larger than in the contact region CR, or to be provided with the insulating layer 150 or insulating layer 151.

Figure 33:
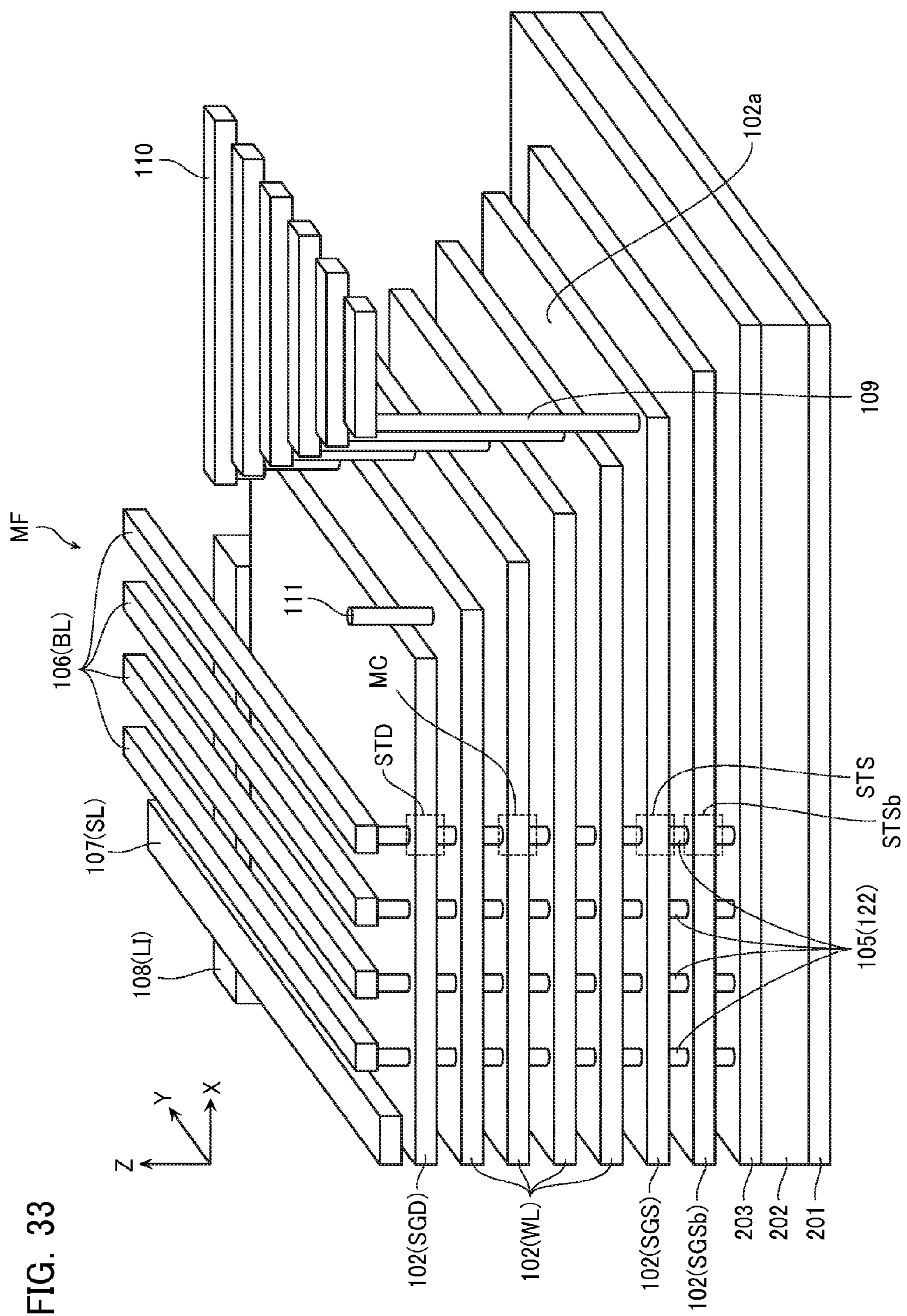
FIG. 33 is a perspective view showing a configuration of part of a nonvolatile semiconductor memory device according to another embodiment.

In addition, as shown in FIG. 3, in the first through fifth embodiments, lower ends of the memory columnar body 105 and the conductive layer 108 functioning as the source contact LI contacted the upper surface of the substrate 101. However, the lower ends of the memory columnar body 105 and the conductive layer 108 may be connected by the likes of a wiring line provided on the substrate. In the example shown in FIG. 33, for example, a circuit layer 202 and a conductive layer 203 are provided between a substrate 201 and the stacked body LB. The substrate 201 is a semiconductor substrate, for example. The circuit layer 202 includes the likes of a field effect transistor and/or wiring line, for example. The conductive layer 203 is formed from the likes of a semiconductor such as polysilicon or a metal such as tungsten (W). Moreover, the conductive layer 203 is connected to the lower ends of the memory columnar body 105 and the conductive layer 108 functioning as the source contact LI.

[Others]

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device, comprising
a first region, a second region, and a third region,
the first region including:
a part of a stacked body that includes a plurality of conductive layers stacked above a substrate; and
a memory columnar body provided along a first direction intersecting the substrate, the memory columnar body having its side surface covered by the stacked body and configuring a memory string,
the second region including:
a contact;
a contact portion connected to the contact, of the conductive layer; and
a plurality of first columnar bodies provided along the first direction, the plurality of first columnar bodies each having their side surface covered by the plurality of conductive layers,
the third region including:
another part of the stacked body; and
a second columnar body provided along the first direction, the second columnar body having its side surface covered by the stacked body, and
in a plane parallel to the substrate, a total area of the second columnar body in a small region that has the same area as one or more contact portions, in the third region being larger than a total area of the first columnar body in the one or more contact portions.

2. The semiconductor memory device according to claim 1, wherein
in a plane parallel to the substrate, an area of the second columnar body per unit area in the third region is larger than an area of the first columnar body per unit area in the second region.

3. The semiconductor memory device according to claim 1, wherein
the small region in the third region includes a plurality of the second columnar bodies, and
in a plane parallel to the substrate, a distance of fellow second columnar bodies in the small region in the third region is shorter than a distance of fellow first columnar bodies in the one or more contact portions.

4. The semiconductor memory device according to claim 1, wherein
a width of the second columnar body is larger than a width of the first columnar body.

5. The semiconductor memory device according to claim 4, wherein
the conductive layer has as its longitudinal direction a second direction parallel to the substrate, and
the second columnar body has the second direction as its longitudinal direction in a plane parallel to the substrate.

6. The semiconductor memory device according to claim 4, wherein the conductive layer has as its longitudinal direction a second direction parallel to the substrate, and the second columnar body has as its longitudinal direction a third direction parallel to the substrate and intersecting the second direction, in a plane parallel to the substrate.

7. The semiconductor memory device according to claim 4, wherein the conductive layer has as its longitudinal direction a second direction parallel to the substrate, and the second columnar body comprises:

a plurality of first portions provided in a third direction parallel to the substrate and intersecting the second direction, in a plane parallel to the substrate, the plurality of first portions each having the second direction as their longitudinal direction; and a second portion connected to the plurality of first portions.

8. The semiconductor memory device according to claim 1, wherein the third region is adjacent to the first region in a second direction parallel to the substrate, and an end in the second direction of the stacked body is provided in the third region.

9. The semiconductor memory device according to claim 1, wherein in the third region, part of the stacked body is formed in a corner shape in a plane parallel to the substrate.

10. The semiconductor memory device according to claim 1, further comprising a fourth region adjacent to the first region from a third direction parallel to the substrate, wherein the fourth region includes:

a part of a second stacked body that includes a plurality of second conductive layers stacked above the substrate; and a second memory columnar body disposed along the first direction intersecting the substrate, the second memory columnar body having its side surface covered by the second stacked body and configuring a memory string, and the second region is provided to sides in a second direction parallel to the substrate and intersecting the third direction, of the first region and the fourth region.

11. The semiconductor memory device according to claim 10, wherein the third region is provided between the fourth region and the second region, and in the third region, part of the stacked body is formed in a corner shape in a plane parallel to the substrate.

12. The semiconductor memory device according to claim 11, further comprising a fifth region provided between the second region and the fourth region, wherein the fifth region includes:

another part of the second stacked body; and a third columnar body provided along the first direction, the third columnar body having its side surface covered by the second stacked body, and an end in the second direction of the second stacked body is provided in the fifth region.

13. The semiconductor memory device according to claim 1, wherein a plurality of the small regions having the same area as the contact portion are provided along an end of the stacked body in the third region, and a total area of the second columnar portion in each of the small regions is larger than a total area of the first columnar portion in the contact portion.

14. A semiconductor memory device, comprising a first region and a second region, the first region including:

a part of a stacked body that includes a plurality of conductive layers and a plurality of inter-layer insulating layers stacked alternately above a substrate; and a memory columnar body provided along a first direction intersecting the substrate, the memory columnar body having its side surface along a second direction covered by the stacked body and configuring a memory string, the second direction intersecting the first direction and the second region including:

another part of the stacked body; and a plurality of first insulating layers that have their side surfaces along the second direction covered by the conductive layers and are stacked via the inter-layer insulating layer.

15. The semiconductor memory device according to claim 14, wherein the second region is adjacent to the first region in the second direction parallel to the substrate, and an end in the second direction of the stacked body is provided in the second region.

16. The semiconductor memory device according to claim 14, wherein in the second region, part of the stacked body is formed in a corner shape in a plane parallel to the substrate.

17. The semiconductor memory device according to claim 14, further comprising a third region, wherein the third region includes:

another part of the stacked body; and a contact connected to a surface of the conductive layer.

18. The semiconductor memory device according to claim 17, further comprising a fourth region, wherein the fourth region includes:

a part of a second stacked body that includes a plurality of second conductive layers and a plurality of second inter-layer insulating layers stacked alternately above the substrate; and a second memory columnar body disposed along the first direction intersecting the substrate, the second memory columnar body having its side surface covered by the second stacked body and configuring a memory string, the fourth region is adjacent to the first region from a third direction parallel to the substrate, and the third region is provided to sides in the second direction parallel to the substrate and intersecting the third direction, of the first region and the fourth region.

19. The semiconductor memory device according to claim 18, wherein the second region is provided between the fourth region and the third region, and in the second region, part of the stacked body is formed in a corner shape in a plane parallel to the substrate.

20. The semiconductor memory device according to claim 19, further comprising a fifth region provided between the second region and the fourth region, wherein the fifth region includes:

another part of the second stacked body; and a plurality of second insulating layers that have their side surfaces covered by the second conductive layers and are stacked via the second inter-layer insulating layers, and an end in the second direction of the second stacked body is provided in the fifth region.

21. The semiconductor memory device according to claim 14, wherein a barrier metal layer is formed between the conductive layer and the memory columnar body, and the barrier metal layer is formed also between the conductive layer and the first insulating layer.

22. The semiconductor memory device according to claim 21, wherein a third insulating layer is further formed between the memory columnar body and the barrier metal layer, and the third insulating layer is formed also between the barrier metal layer and the first insulating layer.

23. A semiconductor memory device, comprising a first region, a second region, a third region, a fourth region, and a fifth region, the first region including:

a part of a first stacked body that includes a plurality of first conductive layers and a plurality of first inter-layer insulating layers stacked alternately above a substrate; and a first memory columnar body provided along a first direction intersecting the substrate, the first memory columnar body having its side surface covered by the first stacked body and configuring a memory string, the second region including:

another part of the first stacked body; and a first contact connected to a surface of the conductive layer, the third region including:

further another part of the first stacked body; and a plurality of first insulating layers that have their side surfaces covered by the first conductive layers and are stacked via the first inter-layer insulating layers, the fourth region including:

a part of a second stacked body that includes a plurality of second conductive layers and a plurality of second inter-layer insulating layers stacked alternately above the substrate; and a second memory columnar body provided along a first direction intersecting the substrate, the second memory columnar body having its side surface covered by the second stacked body and configuring a memory string, and the fifth region including:

another part of the second stacked body; and a plurality of second insulating layers that have their side surfaces covered by the second conductive layers and are stacked via the second inter-layer insulating layers.

24. The semiconductor memory device according to claim 23, wherein the second region is adjacent to the first region from a second direction parallel to the substrate, the first region is adjacent to the fourth region from a third direction parallel to the substrate and intersecting the second direction, and the third region and the fifth region are provided between the fourth region and the second region.

25. The semiconductor memory device according to claim 24, wherein in the third region, part of the first stacked body is formed in a corner shape in a plane parallel to the substrate, and an end in the second direction of the second stacked body is provided in the fifth region.

26. The semiconductor memory device according to claim 23, wherein a barrier metal layer is formed between the first conductive layer and the first memory columnar body, and the barrier metal layer is formed also between the first conductive layer and the first insulating layer.

27. The semiconductor memory device according to claim 26, wherein a third insulating layer is further formed between the first memory columnar body and the barrier metal layer, and the third insulating layer is formed also between the barrier metal layer and the first insulating layer.

* * * * *